United States Patent [19]

Lamanna et al.

[11] Patent Number: 5,554,664
[45] Date of Patent: Sep. 10, 1996

[54] ENERGY-ACTIVATABLE SALTS WITH FLUOROCARBON ANIONS

[75] Inventors: William M. Lamanna, Stillwater; Michael C. Palazzotto, Woodbury; Wayne S. Mahoney, St. Paul; Michael A. Kropp, Cottage Grove, all of Minn.

[73] Assignee: Minnesota Mining and Manufacturing Company, St. Paul, Minn.

[21] Appl. No.: 558,245

[22] Filed: Nov. 17, 1995

Related U.S. Application Data

[63] Continuation-in-part of Ser. No. 398,606, Mar. 6, 1995, abandoned.

[51] Int. Cl.$^6$ .................................................. C08F 2/46
[52] U.S. Cl. ........................... 522/25; 522/29; 522/31
[58] Field of Search ................................. 522/25, 29, 31

[56] References Cited

U.S. PATENT DOCUMENTS

| | | | |
|---|---|---|---|
| 3,423,299 | 1/1966 | Loree et al. | 204/59 |
| 4,039,521 | 8/1977 | Smith | 260/141 |
| 4,049,861 | 9/1977 | Nozari | 428/220 |
| 4,115,295 | 9/1978 | Robins et al. | 528/90 |
| 4,472,479 | 9/1984 | Hayes et al. | 428/324 |
| 5,061,605 | 10/1991 | Kawamura et al. | 430/281 |
| 5,064,747 | 11/1991 | Imai et al. | 430/278 |
| 5,273,840 | 12/1993 | Dominey | 429/192 |

OTHER PUBLICATIONS

Phenyl Ester of the Aci Form of Tris (Trifluoromethylsulfonyl) Methane, Yu L. Yagupol'skii et al., pp. 584–585 Translation of Zhurnal Organicheskol Khimii, vol. 26 No 3, Mar. 1990.

Synthesis and Decomposition of Benzenediazonium Tris ((trifluoromethyl) sulfonyl) Methanide $C_6H_5N_2+(CF_3SO_2)_3C-$, and Benzenediazonium Bis ((trifluoromethyl)sulfonyl) amide $C_6H_5N_2+(CF_3SO_2)_2N-$, and the Cyclic Analogue, $C_6H_5N_2+SO_2(CF_2)_3SO_2N-^1$, Shi–Zhen et al., Inorganic Chem. vol. 32 No. 2, pp. 223–226, 1993.

The Chemistry of Synthetic Dyes, vol. IV, Academic Press, 1971, by K. Venkataraman, National Chemical Laboratory, Poona, India pp. 161–211.

*Primary Examiner*—Mark Chapman
*Attorney, Agent, or Firm*—Gary L. Griswold; Walter N. Kirn; Carolyn V. Peters

[57] ABSTRACT

An energy-sensitive (e.g., thermal, radiation or photosensitive) initiator, curative, and/or catalytic salt that has an anion comprising a tris-(highly fluorinated alkylsulfonyl)methide, tris-(fluorinated arylsulfonyl)methide, bis-(highly fluorinated alkyl)sulfonyl imide, bis-(fluorinated aryl)sulfonyl imide, mixed aryl- and alkylsulfonyl imides and methides and any combinations thereof, has improved solubility in organic solvents, exhibit minimal corrosiveness when coatings and adhesives are prepared using the initiator, curative and/or catalytic salts, generates a highly reactive initiator, curative, and/or catalyst upon activation by energy.

27 Claims, No Drawings ic to have utility as photochemically activated initiators for cationic addition polymerization or as similarly activatable latent Brönsted- or Lewis-acid catalysts for step-growth (or condensation) polymerization, depolymerization and unblocking of functionalized polymers. Common commercial photoinitiator salts include onium and organometallic salts such as diaryliodonium and triarylsulfonium salts and (cyclopentadienyl)(arene)iron$^+$ salts of the anions $PF_6^-$ and $SbF_6^-$. In certain cases, these same salts may also photoinitiate free-radical addition polymerization and are useful in "dual cure" applications where a mixture of cationically sensitive and free-radically polymerizable monomers are polymerized either simultaneously or sequentially. Similarly, certain classes of these salts are known to be thermally-activatable curatives for cationic, step-growth and free-radical polymerizations.

ENERGY-ACTIVATABLE SALTS WITH FLUOROCARBON ANIONS

RELATED APPLICATIONS

This is a continuation-in-part of U.S. Ser. No. 08/398,606, filed Mar. 6, 1995, now abandoned.

FIELD OF THE INVENTION

The present invention relates to energy-activatable salts, such as thermally or radiation activatable initiator, curative, or catalyst salts having improved properties that may include improved solubility in organic solvents and monomers, improved hydrolytic stability, and higher catalytic activity.

BACKGROUND OF THE INVENTION

Salts comprising an organic, inorganic or organometallic cation and a nonnucleophilic counteranion have been shown to have utility as photochemically activated initiators for cationic addition polymerization or as similarly activatable latent Brönsted- or Lewis-acid catalysts for step-growth (or condensation) polymerization, depolymerization and unblocking of functionalized polymers. Common commercial photoinitiator salts include onium and organometallic salts such as diaryliodonium and triarylsulfonium salts and (cyclopentadienyl)(arene)iron$^+$ salts of the anions $PF_6^-$ and $SbF_6^-$. In certain cases, these same salts may also photoinitiate free-radical addition polymerization and are useful in "dual cure" applications where a mixture of cationically sensitive and free-radically polymerizable monomers are polymerized either simultaneously or sequentially. Similarly, certain classes of these salts are known to be thermally-activatable curatives for cationic, step-growth and free-radical polymerizations.

For many commercial applications, the polymerizable monomers are multifunctional (i.e., contain more than one polymerizable group per molecule), for example, epoxides, such as diglycidyl ethers of bisphenol A (DGEBA) and vinyl ethers, such as 1,4-cyclohexanedimethanol divinyl ether (CHVE). Mixtures of multifunctional monomers such as polyisocyanates and polyalcohols (polyols) or polyepoxides and polyalcohols can undergo acid-catalyzed polycondensation via a step-growth mechanism. Also included in this description are multireactive monomers- those that comprise two or more classes of reactive groups, such as, for instance, a monomer comprising both acrylate and isocyanate functionalites.

Compounds and materials comprising charged ions (i.e., salts) tend to have poor solubility in many organic solvents. As many useful types of compositions are based on organic systems, either organic polymer systems or organic monomer systems, reduced solubility in organic systems limits the field of utility of many ionic materials. Amongst the ionic materials that could benefit from increased solubility in organic systems are polymerization initiators (particularly those based on iodonium, sulfonium, diazonium, phosphonium and organometallic complex cations).

Synthetic modifications of the cationic portion of cationic initiators have been made to improve their solubility in organic systems. However, the difficulty and cost of introducing solubilizing substituents has limited commercial application of these materials. Alternatively, the use of reactive diluents or solid dispersants has also been disclosed.

In many applications photoinduced polymerization is impossible, impractical or undesirable. For example, many situations where polymerization reactions occur in a closed environment (i.e., in a mold or in a laminated product) or where polymerizable compositions may contain opacifying pigments, thermally activated initiators are preferred. Thermally-activated initiators, such as known onium or organometallic salts may initiate polymerization at ambient or higher temperatures depending upon the specific application. Additional additives, such as oxidants, reductants, metal salts, alcohols, organic acids or anhydrides, and combinations thereof are frequently added to control the temperature at which cationic polymerization will occur.

In addition to known onium or organometallic salts, ammonium salts and metal salts of fluoroalkanesulfonic acids and bis(fluoroalkylsulfonyl)methanes have been used as thermal initiators for cationic addition polymerization of vinyl ethers and epoxies or catalysts for alcohol-epoxy step-growth polymerization.

The nature of the counteranion in a complex salt can influence the rate and extent of cationic addition polymerization. For example, J. V. Crivello, and R. Narayan, Chem. Mater., 4, 692, (1992), report that the order of reactivity among commonly used nonnucleophilic anions is $SbF_6^- > AsF_6^- > PF_6^- > BF_4^-$. The influence of the anion on reactivity has been ascribed to three principle factors: (1) the acidity of the protonic or Lewis acid generated, (2) the degree of ion-pair separation in the propagating cationic chain and (3) the susceptibility of the anions to fluoride abstraction and consequent chain termination.

Bis(perfluoroalkylsulfonyl)methides (e.g., U.S. Pat. Nos. 4,039,521; 4,049,861; 4,069,368; 4,100,134; 4,115,295, and 5,136,097) and bis(perfluoroalkylsulfonyl)imides (e.g., U.S. Pat. Nos. 4,031,036; 4,387,222; 4,247,674; 4,429,093, ) have been used as anions for catalysts and initiators. Improvements in the use of those anions and their synthesis have been described in the literature, see for example U.S. Pat. Nos. 3,704,311; 3,758,531; 3,758,591; 3,758,952; and 3,758,953; and J. N. Meussdorffer, et al., Chem. Ztg., 1972, 38, p.582.

The thermal decomposition chemistry of a tris-(perfluoromethylsulfonyl)methide salt of benzene diazonium cation was studied and reported by both Y. L. Yagupolskii, et al., J. Org. Chem. U.S.S.R. (Engl. Transl.), 1990, 26, 584–5; and S. Z. Zhu, et al., Inorg. Chem., 1993, 32, pp. 223–226. Additionally, Zhu studied the thermal decomposition chemistry of the bis(perfluoromethylsulfonyl)imide salt of a benzene diazonium cation, although no catalytic activity for these salts was described.

U.S. Pat. No. 4,049,861 discloses the use of certain classes of catalysts in the curing of epoxide resins and silane resins, including highly fluorinated alkylsulfonyl methanes. A single tris-perfluoroalkylsulfonyl methane is shown on col. 8, line 38, and the class is within the generic formula on column 7. Similarly, U.S. Pat. No. 4,115,295 describes a single tris (perfluoroalkylsulfonyl) methane on column 7, line 11.

U.S. Pat. No. 4,920,182 and 4,957,946 describe energy-polymerizable compositions comprising arene-iron salts of, e.g., fluoroalkylsulfonic acid (fluoroalkylsulfonates). U.S. Pat. No. 5,089,536 describes energy-polymerizable compositions comprising organometallic salts as initiators. Numerous anions are disclosed as being suitable counterions for the organometallic cations disclosed therein.

Co-assigned PCT Patent Application No. 95/03338 describes organometallic initiator salts comprising, aryl borate anions, e.g., tetrakis [3,5bis(trifluoromethyl)phenyl] borate. These non-nucleophililc anions provide enhanced reactivity toward cationic addition polymerization as well as improved solubility in organic media. However, the syntheses of such anions tend not to be cost efficient.

Conductive adhesives useful in the electronics field are known. Such adhesives that enable multiple discrete electrical connections, often in extremely close proximity to each other, between two components are commonly referred to as "anisotropically conductive adhesives" or as "z-axis adhesives." A typical use for this type of material is to provide connection between a flexible printed circuit and a flat panel display. U. S. Pat. No. 5,362,421 describes anisotropically conductive adhesives wherein the thermal initiator comprises an organometallic cation and an anion selected from tetrafluoroborate, hexafluorophosphate, hexafluoroarsenate, hydroxypentafluoroantimonate, trifluoromethanesulfonate and hexafluoroantimonate.

SUMMARY OF THE INVENTION

Energy-activatable salts comprising active cationic species and (a) imide anions having two highly fluorinated alkylsulfonyl, fluorinated arylsulfonyl, or perfluoroalkylsulfonyl groups, and combinations thereof, or (b) methide anions having three highly fluorinated alkylsulfonyl, fluorinated arylsulfonyl, or perfluoroalkylsulfonyl groups, and combinations thereof, exhibit improved solubility in organic media and/or very strong catalytic activity. These anions are stable, non-nucleophilic, and demonstrate reduced redox reactivity. The salts do not readily hydrolyze to release fluoride ions that may be corrosive, nor do they contain highly toxic elements such as arsenic and antimony.

Briefly, in one aspect of the present invention, energy activatable salts are provided wherein the energy activatable salt has (1) a cation comprising at least one of (a) an organometallic cation, wherein the organometallic cation comprises (i) substituted or unsubstituted aromatic compounds based on arene or cyclopentadienyl ligands and, (ii) a transition metal atom, (b) an I-, P-, C- and S-centered organic onium cation, or (c) a mixture thereof, and (2) a sufficient number of an anion to neutralize the charge of the cation, wherein the anion comprises a tris-(highly fluorinated alkylsulfonyl)methide, tris-(fluorinated arylsulfonyl)methide, bis-(highly fluorinated alkylsulfonyl) imide, bis-(fluorinated arylsulfonyl) imide, mixed aryl- and alkylsulfonyl imides and methides and any combinations thereof and with the proviso that the salt is not a diazonium salt, an ammonium salt, or a simple metal salt.

The invention provides polymerizable compositions comprising (1) at least one of cationic addition polymerizable monomers, ethylenically-unsaturated free-radically polymerizable monomers, multifunctional or multireactive monomers polymerizable by acid-catalyzed step-growth polymerization, multifunctional or multireactive monomers polymerizable by any combination of these polymerization mechanisms, and combinations thereof; and (2) an energy-activatable salt, the cation of which has initiating, curing, or catalytic properties when activated by energy, wherein said energy-activatable salt has an anion comprising an imide anion comprising generally two highly fluorinated alkylsulfonyl, fluorinated arylsulfonyl, or perfluoroalkylsulfonyl groups or combinations thereof, or a methide anion comprising generally three highly fluorinated alkylsulfonyl, fluorinated arylsulfonyl, or perfluoroalkylsulfonyl groups or combinations thereof.

In yet an aspect of the present invention, a conductive adhesive composition is provided comprising: the above-identified curable composition along with a plurality of conductive particles and optionally a thermoplastic resin and the monomer is an epoxy resin.

A particularly useful conductive adhesive composition according to the present iinvention is one that comprises:

(a) at least one cationically curable epoxy monomer;

(b) optionally, at least one thermoplastic oligomeric or polymeric resin essentially free of nucleophilic groups, such as amine, amide, nitrile, sulfur, or phosphorous functional groups or metal-complexing groups, such as carboxylic acid or sulfonic acid;

(c) optionally, a hydroxyl-functional material;

(d) an energy-activable initiator comprising:

(1) at least one salt of an organometallic cation, comprising (a) an organometallic cation comprised of (i) a substituted or unsubstituted aromatic compounds based on a benzene or cyclopentadienyl ligands and, (ii) a transition metal atom, and b) a sufficient number of anions to neutralize the charge of the cation, wherein the anion is a methide or imide anion of the invention;

(2) optionally, at least one stabilizing additive; and (3) optionally, at least one cure rate enhancer;

(e) a plurality of conductive particles;

(f) optionally, at least one silane coupling agent; and (g) optionally, additional adjuvants.

In a further aspect, the present invention provides a novel and significantly improved method for the direct synthesis of the $(CF_3SO_2)_3C^-$ anion that affords high methide yields (66±6%). Key elements of the improved process include: (1) use of essentially HF-free $CF_3SO_2F$ that may be obtained through washing with tributylamine; (2) elimination of essentially all traces of water from reagents and reactor; (3) slow, metered addition of a stoichiometric excess of $CF_3SO_2F$ into the methyl Grignard solution and (4) a relatively low-cost and efficient purification process involving recrystallization of the intermediate tetramethylammonium methide salt.

In another aspect, a process is provided for making a conductive adhesive interconnection by providing the thermally curable conductive adhesive composition described above and adding sufficient thermal energy to cure the composition In yet another aspect, the invention provides an article comprising a substrate having on at least one surface thereof a layer of the conductive adhesive composition of the invention. The invention also provides a method of making the article, comprising the steps:

(a) providing a substrate;

(b) coating at least: one surface thereof with the cationically curable conductive adhesive described above; and (c) supplying sufficient energy to cure the composition.

Preferably, the cationically curable conductive adhesive of the invention is an anisotropically conductive adhesive, by which is meant that the adhesive composition provides electrical conductivity between facing electrodes or circuit traces but maintains electrical insulation laterally between adjacent electrodes or circuit traces.

DESCRIPTION OF THE PREFERRED EMBODIMENT(S)

The present invention provides catalysts and initiator salts comprising a thermally- or photochemically-reactive cationic portion and a nonnucleophilic anion. Energy-activatable salts in which the anion comprises a tris-(fluorinated alkyl- or aryl-sulfonyl)methide, bis-(fluorinated alkyl- or aryl-sulfonyl) imide anion, and combinations thereof, including mixed alkyl- and aryl-sulfonyls display improved solubility in organic systems and/or generate a highly reactive initiator, curative, or catalyst upon energy activation, and/or display low corrosive activity after use. The salts of the present invention further avoid the use of salts of toxic elements such as arsenic and antimony, and are relatively inexpensive to manufacture.

The initiating, curing, and/or catalytic activity of certain energy-activatable salts and their solubility in organic compounds (particularly in low polarity compounds such as energy-curable monomers) can be improved by using particular classes of counteranions in association with cationic groups thereof to form thermal- or photoactive catalyst generating materials. The compounds of this invention shall be referred to as "energy activatable," which is inclusive of many different forms of energy activation, including, but not limited to photoactivation, thermal activation, electron beam activation, and other electromagnetic radiation activation that stimulates, activates, or releases the active species. The catalyst-generating materials of the present invention can display improved solubility in organic media, particularly low polarity media such as energy-curable monomers or non-polar organic solvents such as ketones (e.g., methyl ethyl ketone), ethers, methylene chloride, and the like.

The broad class of cationic photoactive groups recognized in the catalyst and photoinitiator industries may be used in the practice of the present invention. Photoactive cationic nuclei, photoactive cationic moieties, and photoactive cationic organic compounds are art recognized classes of materials as exemplified by U.S. Pat. Nos. 4,250,311; 3,708,296; 4,069,055; 4,216,288; 5,084,586; 5,124,417; 4,985,340 and 5,089,536.

Cations useful as the cationic portion of the catalysts and initiators of the invention include:

(1) organic onium cations, for example those described in U.S. Pat. Nos. 4,250,311, 3,708,296, 4,069,055, 4,216,288, 5,084,586 and 5,124,417 and such descriptions incorporated herein by reference, including aliphatic or aromatic Group IVA-VIIA (CAS version) centered onium salts, preferably I-, S-, P-, and C-centered onium salts, such as those selected from, sulfoxonium, diaryliodonium, triarylsulfonium, carbonium and phosphonium, and most preferably I-, and S-centered onium salts, such as those selected from sulfoxonium, diaryliodonium, and triarylsulfonium, wherein "aryl" means an unsubstituted or substituted aromatic moiety having up to four independently selected substituents. The substituents on the aryl ring will preferably have less than 30 carbon atoms and up to 10 heteroatoms selected from N, S, non-peroxidic O, P, As, Si, Sn, B, Ge, Te, Se, examples include hydrocarbyl groups such as methyl, ethyl, butyl, dodecyl, tetracosanyl, benzyl, allyl, benzylidene, ethenyl and ethynyl; hydrocarbyloxy groups such as methoxy, butoxy and phenoxy; hydrocarbylmercapto groups such as methylmercapto and phenylmercapto; hydrocarbyloxycarbonyl groups such as methoxycarbonyl and phenoxycarbonyl; hydrocarbylcarbonyl groups such as formyl, acetyl and benzoyl; hydrocarbylcarbonyloxy groups such as acetoxy and cyclohexanecarbonyloxy; hydrocarbylcarbonamido groups such as acetamido and benzamido; azo; boryl; halo groups such as chloro, bromo, iodo and fluoro; hydroxy; oxo; diphenylarsino; diphenylstibino; trimethylgermano; trimethylsiloxy; and aromatic groups such as cyclopentadienyl, phenyl, tolyl, naphthyl, and indenyl. With the sulfonium salts, it is possible for the substituent to be further substituted with a dialkyl- or diarylsulfonium cation; an example of this would be 1,4-phenylene bis(diphenylsufonium);

(2) organometallic complex cations essentially free of metal hydride or metal alkyl functionality selected from those described in U.S. Pat. No. 4,985,340 and such description is incorporated herein by reference and has the formula:

wherein

M represents a metal selected from the group consisting of Cr, Mo, W, Mn, Re, Fe, Ru, Os, Co, Rh, Ir, Pd, Pt and Ni, preferably Cr, Mo, W, Mn, Fe, Ru, Co, Pd, and Ni; and most preferably Mn and Fe;

$L^1$ represents 1 or 2 cyclic, polyunsaturated ligands that can be the same or different ligand selected from the group consisting of substituted and unsubstituted cyclopentadienyl, cyclohexadienyl, and cycloheptatrienyl, cycloheptatriene, cyclooctatetraene, heterocyclic compounds and aromatic compounds selected from substituted or unsubstituted arene compounds and compounds having 2 to 4 fused rings, and units of polymers, e.g., a phenyl group of polystyrene, poly(styrene-co-butadiene), poly(styrene-co-methyl methacrylate), poly($\alpha$-methylstyrene), and the like; a cyclopentadiene group of poly(vinylcyclopentadiene); a pyridine group of poly(vinylpyridine), and the like, each capable of contributing 3 to 8 electrons to the valence shell of M;

$L^2$ represents none, or 1 to 3 nonanionic ligands contributing an even number of electrons that can be the same or different ligand selected from the group of carbon monoxide, ketones, olefins, ethers, nitrosonium, phosphines, phosphites, and related derivatives of arsenic and antimony, organonitriles, amines, alkynes, isonitriles, dinitrogen, with the proviso that the total electronic charge contributed to M results in a net residual positive charge of q to the complex;

q is an integer having a value of 1 or 2, the residual charge of the complex cation; and Organometallic salts are known in the art and can be prepared as described in, for example, EPO No. 094,914 and U.S. Pat. Nos. 5,089,536, 4,868,288, and 5,073,476, and such descriptions are incorporated herein by reference. The organometallic cations useful in the present invention are generally not useful for catalyzing Ziegler-Natta or coordination-type polymerizations of olefins or acetylenes because such polymerization requires metal hydride or metal-alkyl functionality not present in the catalyst or initiator salts useful in the present invention. Furthermore, useful organometallic initiators of the present invention do not require metal hydride or metal alkyl co-catalysts, as are commonly employed in Ziegler-Natta or coordination catalysts for olefin and acetylene polymerizations. In contrast to Ziegler-Natta catalysts, the organometallic initiators of the present invention are generally stable and active under ambient conditions that may include normal levels of atmospheric oxygen and water.

Anions useful as the anionic portion of the catalysts and initiators of the present invention may be generally classified as fluorinated (including highly fluorinated and perfluorinated) tris alkyl- or arylsulfonyl methides and corresponding bis alkyl- or arylsulfonyl imides, as represented by Formulas 2a and 2b, respectively, and hereinafter referred to as "methide" and "imide" anions, respectively, for brevity,

wherein each $R_f$ is independently selected from the group consisting of highly fluorinated or perfluorinated alkyl or fluorinated aryl radicals. The methides and imides may also be cyclic, when a combination of any two $R_f$ groups are linked to form a bridge.

The $R_f$ alkyl chains may contain from 1–20 carbon atoms, with 1–12 carbon atoms preferred. The $R_f$ alkyl chains may be straight, branched, or cyclic and preferably are straight. Heteroatoms or radicals such as divalent oxygen, trivalent nitrogen or hexavalent sulfur may interrupt the skeletal chain, as is well recognized in the art. When $R_f$ is or contains a cyclic structure, such structure preferably has 5 or 6 ring members, 1 or 2 of which can be heteroatoms. The alkyl radical $R_f$ is also free of ethylenic or other carbon-carbon unsaturation: e.g., it is a saturated aliphatic, cycloaliphatic or heterocyclic radical. By "highly fluorinated" is meant that the degree of fluorination on the chain is sufficient to provide the chain with properties similar to those of a perfluorinated chain. More particularly, a highly fluorinated alkyl group will have more than half the total number of hydrogen atoms on the chain replaced with fluorine atoms. Although hydrogen atoms may remain on the chain, it is preferred that all hydrogen atoms be replaced with fluorine to form a perfluoroalkyl group, and that any hydrogen atoms beyond the at least half replaced with fluorine that are not replaced with fluorine be replaced with bromine and or chlorine. It is more preferred that at least two out of three hydrogens on the alkyl group be replaced with fluorine, still more preferred that at least three of four hydrogen atoms be replaced with fluorine and most preferred that all hydrogen atoms be replaced with fluorine to form a perfluorinated alkyl group.

The fluorinated aryl radicals of Formulas 2a and 2b may contain from. 6 to 22 ring carbon atoms, preferably 6 ring carbon atoms, where at least one, and preferably at least two, ring carbon atoms of each aryl radical is substituted with a fluorine atom or a highly fluorinated or perfluorinated alkyl radical as defined above, e.g., $CF_3$.

Examples of anions useful in the practice of the present invention include: $(C_2F_5SO_2)_2N^-$, $(C_4F_9SO_2)_2N^-$, $(C_8F_{17}SO_2)_3C^-$, $(CF_3SO_2)_3C^-$, $CF_3SO_2)_2N^-$, $(C_4F_9SO_2)_3C^-$, $(CF_3SO_2)_2(C_4F_9SO_2)C^-$, $(CF_3SO_2)(C_4F_9SO_2)N^-$, $[(CF_3)_2NC_2F_4SO_2N^-$, $(CF_3)_2NC_2F_4SO_2C^-(SO_2CF_3)_2$, $(3,5-bis(CF_3)C_6H_3)SO_2N^-SO_2CF_3$,

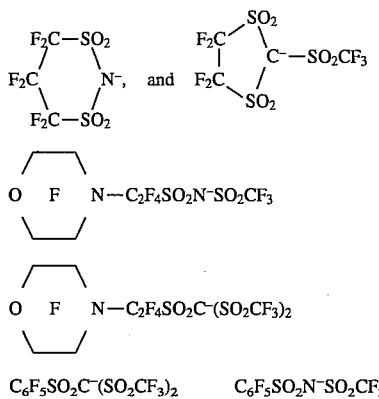

and the like. More preferred anions are those described by Formula 2a wherein $R_f$ is a perfluoroalkyl radical having 1–4 carbon atoms.

Anions of this type, and representative syntheses, are described in, e.g., U.S. Pat. Nos. 4,505,997, 5,021,308, 4,387,222, 5,072,040, 5,162,177, and 5,273,840, incorporated herein by reference, and in Turowsky and Seppelt, Inorg. Chem., 27, 2135–2137, (1988). Turowsky and Seppelt describe the direct synthesis of the $(CF_3SO_2)_3C^-$ anion from $CF_3SO_2F$ and $CH_3MgCl$ in 20% yield based on $CF_3SO_2F$ (19% based on $CH_3MgCl$).

Thus, the present invention provides a novel and significantly improved method for the direct synthesis of the $(CF_3SO_2)_3C^-$ anion that affords high methide yields (66±6%). Key elements of the improved process include: (1) use of essentially HF-free $CF_3SO_2F$, that is, $CF_3SO_2F$ contains less than 1 mole % of HF that may be obtained through washing with tributylamine or other non-nucleophilic bases; (2) elimination of essentially all traces of water from reagents and reactor; (3) slow, metered addition of a stoichiometric excess of $CF_3SO_2F$ into the methyl Grignard solution, wherein $CF_3SO_2F$ is added at a rate of less than 5% of the total volume of $CF_3SO_2F$ per minute and preferably less than 1%/minute and (4) a relatively low-cost and efficient purification process involving recrystallization of the intermediate tetramethylammonium methide salt. For example, recrystallization of the intermediate can be achieved by precipitating the tetramethylammonium methide salt in water, redissolving the precipitate in hot methanol, adding more water to crystallize the methide salt again, distilling all of the methanol away (causes methide salt to further precipitate out of solution), filter and repeat until the desired purity is obtained.

Examples of preferred catalysts (and mixtures of such catalysts) are the $(CF_3SO_2)_2N^-$, $(CF_3SO_2)_3C^-$, and $(C_4F_9SO_2)_3C^-$ anions of the following cations:

diphenyliodonium, ditolyliodonium, didodecylphenyliodonium, (4-octyloxyphenyl)phenyliodonium, and bis-(methoxyphenyl)iodonium;

triphenylsulfonium, diphenyl-4-thiophenoxyphenylsulfonium, and 1,4-phenylene-bis(diphenylsufonium);

bis($\eta^5$-cyclopentadienyl)iron(1+), bis($\eta^5$-methylcyclopentadienyl)iron (1+), ($\eta^5$-cyclopentadienyl)($\eta^5$-methylcyclopentadienyl)iron (1+), and bis($\eta^5$-trimethylsilylcyclopentadienyl)iron (1+);

bis($\eta^6$-xylenes)iron (2+), bis($\eta^6$-mesitylene)iron (2+), bis($\eta^6$-durene)iron (2+), bis($\eta^6$-pentamethylbenzene)iron (2+), and bis($\eta^6$-dodecylbenzene) iron (2+);

($\eta^5$-cyclopentadienyl)($\eta^6$-xylenes)iron(1+), ($\eta^5$-cyclopentadienyl)($\eta^6$-toluene)iron(1+), ($\eta^5$-cyclopentadienyl)($\eta^6$-mesitylene)iron(1+), ($\eta^5$-cyclopentadienyl)($\eta^6$pyrene)iron(1+), ($\eta^5$-cyctopentadienyl)($\eta^6$-naphthalene)iron(1+), and ($\eta^5$-cyclopentadienyl)($\eta^6$-dodecylphenyl)iron(1+).

Salts of the above described anions and cations may be activated by radiation or by heat or may require two stage activation involving radiation followed by heat. Suitable salts having such cations and a nonnucleophilic anion for use in the polymerizable compositions of the instant invention are those salts that upon application of sufficient energy-thermal, accelerated particle (electron beam), or electromagnetic radiation having a wavelength from about 200 to 800 nm—will generate an active species capable of initiating or catalyzing the polymerization of the polymerizable compositions of the invention. The level of catalyst or initiator activity will of course depend on the choice of cation and nonnucleophilic anion in the salt and on the monomer.

Polymerizable systems comprising polymerizable monomers, energy-activatable catalysts for inducing polymerization of the monomers (e.g., cationic polymerization, free radical initiation, Brönsted acid catalysis, Lewis Acid catalysis, etc), and, optionally, solvents can particularly benefit from the practice of the present invention. Spectral sensitizing dyes used with photoinitiators may also have anions of the present invention associated with them to improve their solubility and stability in the polymerized product.

In general, catalyst or initiator salts of the instant invention can be prepared by anion exchange or metathesis reactions by combining initiator or catalyst free acids or salts that contain conventional counteranions, such as chloride, $PF_6^-$, $SbF_6^-$ or $BF_4^-$, with simple salts, such as alkali or alkaline earth metal salts or ammonium salts, of the nonnucleophilic anions of the invention in a suitable solvent. Generally, metathesis reactions may be carried out at temperatures ranging from about −80° to about 100° C., preferably at ambient temperature, under conditions in which either the initiator/catalyst salt of the instant invention or the metathesis byproduct(s) selectively precipitates, thus permitting isolation of the salt of the invention in the form of a solution or a pure solid. Alternatively, anion metathesis may be achieved by passing a solution of a background art initiator or catalyst salt through a column of an insoluble anion exchange resin containing a nonnucleophilic anion of the invention. It will, of course, be appreciated that the catalyst/initiator salts of the invention will form in situ if the individual components described supra are added directly to the polymerization process and a suitable solvent or diluent, including monomer, is used in the polymerization process. It is preferred, however, to form the pure catalyst or initiator in a separate step as a solid or in a suitable solvent prior to adding the same to the polymerizable composition and performing the polymerization process.

Suitable metathesis solvents generally are capable of dissolving at least one and preferably all of the reagents required for the metathesis reaction without reacting with these reagents. Solvents are generally selected such that the desired salt or the metathesis byproducts selectively precipitate, thus allowing the desired salt to be isolated in relatively pure form. Normally, the preferred solvent for a particular system is determined empirically. In the cases where an anion exchange resin is used, the solvent should not dissolve the resin, but should dissolve the metathesis reagents and the desired product salt. Nonlimiting examples of suitable solvents include, water; chlorocarbons, such as methylene chloride, and chloroform; ethers; aromatic hydrocarbons, such as toluene, and chlorobenzene; nitriles, such as, acetonitrile; alcohols, such as methanol and ethanol; nitrobenzene; nitromethane; ketones, such as acetone and methyl ethyl ketone; and other similar classes of organic solvents. Mixtures of solvents are often desirable to control solubility of reagents and product salts. It is to be noted that cationic organometallic catalysts employing the counterions of the invention can be prepared in, e.g., protic solvents and in the presence of oxygen, in contrast to other known organometallic catalysts used, in particular, for Ziegler-Natta polymerizations of olefinic or acetylenic monomers.

As used herein,

"multifunctional" means the presence of more than one of the same functional reactive group in a monomer;

"multireactive" means the presence of two or more of two different functional reactive groups;

"acid catalyst" or "acid catalyzed" means catalysis by a Brönsted- or Lewis-acid species; and "molecular weight" means number average molecular weight (Mn), unless otherwise specified.

Polymerizable Compositions and Polymers

The present invention also provides polymerizable compositions comprising (1) at least one of cationic addition polymerizable monomers, ethylenically-unsaturated free radically polymerizable monomers, multifunctional or multireactive monomers polymerizable by acid-catalyzed step-growth polymerization, multifunctional or multireactive monomers polymerizable by any combination of these polymerization mechanisms, or mixtures thereof and (2) a catalyst or initiator salt of the present invention and a method for the polymerization comprising the steps of:

(a) providing a monomer mixture comprising at least one of a cationically polymerizable monomer, an ethylenically-unsaturated free radically polymerizable monomer, or multifunctional or multireactive monomers polymerizable by acid-catalyzed step-growth polymerization, or multifunctional or multireactive monomers polymerizable by any combination of these polymerization mechanisms, and mixtures thereof, (b) adding a catalytically effective amount of a curing agent to the monomer mixture wherein the curing agent comprises at least one of the initiator or catalyst salts of the instant invention (and all permutations of the order of mixing the aforementioned components), thereby forming a polymerizable composition, and (c) allowing the polymerizable composition to polymerize or adding a sufficient amount of energy to the mixture to effect polymerization.

The present invention further provides a method for preparing coated articles containing the cured composition of the invention comprising the steps of:

(a) providing a substrate, (b) coating an energy polymerizable composition of step (b) as described above onto at least one surface of the substrate by methods known in the art, such as bar, knife, reverse roll, knurled roll, curtain, or spin coatings, or by dipping, spraying, brushing, and the like, with or without a coating solvent, and (c) applying energy (after evaporation of solvent, if necessary) to the coating and, if desired, to the article to cause the polymerization of the coating.

It may be desirable to add solvent to solubilize components and aid in processing. Solvent, preferably organic solvent, may be present in an amount up to 99 weight percent, preferably in the range of 0 to 90 weight percent, and most preferably in the range of 0 to 75 weight percent, of the total composition.

In the polymerizable compositions of this invention, the catalyst or initiator salts can be present in a catalytically effective amount to initiate polymerization, and is generally in the range of 0.01 to 20 weight percent (wt %), preferably 0.1 to 10 wt % of the curable composition; i.e., the total composition excluding any solvent that may be present.

Monomers

A wide variety of monomers can be energy polymerized using the catalysts and initiators of the invention. Included are monomers selected from the group consisting of cationically-polymerizable monomers, free-radically-polymerizable monomers, and acid-catalyzed step-growth polymerizable monomers. These groups do not include olefinic or acetylenic monomers that are polymerizable by insertion-type coordination polymerization (Ziegler-Natta polymerization.). Preferred monomers are acid-catalyzed step-growth polymerizable monomers and cationically-polymerizable monomers, with the more preferred monomers being the cationically-polymerizable monomers.

Cationically Polymerizable Monomers

Suitable cationically polymerizable monomers and/or oligomers typically contain at least one cationically polymerizable group such as epoxides, cyclic ethers, vinyl ethers, vinylamines, side-chain unsaturated aromatic hydrocarbons, lactones and other cyclic esters, lactams, oxazolines, cyclic carbonates, cyclic acetals, aldehydes, cyclic amines, cyclic sulfides, cyclosiloxanes, cyclotriphosphazenes and mixtures thereof, preferably epoxides and vinyl ethers. Other cationically polymerizable groups or monomers described in G. Odian, "Principles of Polymerization" Third Edition, John Wiley & Sons Inc., 1991, NY. and "Encyclopedia of Polymer Science and Engineering," Second Edition, H. F. Mark, N. M. Bikales, C. G. Overberger, G. Menges, J. I. Kroschwitz, Eds., Vol. 2, John Wiley & Sons, 1985, N.Y., pp. 729–814 are also useful in the practice of the present invention.

Particularly useful examples include cyclic ether monomers, including epoxide monomers described in U.S. Pat. No. 4,985,340 and such description is incorporated herein by reference. A wide variety of commercial epoxy resins are available and listed in "Handbook of Epoxy Resins" by Lee and Neville, McGraw Hill, New York (1967) and in "Epoxy Resin Technology" by P. F. Bruins, John Wiley & Sons, New York (1968). Preferably, when used in conductive adhesives, the epoxy resins are "electronic grade," that is, low in ionic contaminants.

Useful epoxy resins can include propylene oxide, epichlorohydrin, styrene oxide and epoxies based upon bisphenol A, such as, EPON-828-LS™ electronic grade epoxy resins available from Shell Chemicals, or novolac epoxies, such as, EPON-164™ (also available from Shell Chemicals) or their equivalents from other manufacturers. Additional useful epoxy resins include dicylcopentadiene dioxide, epoxidized polybutadiene such as the Poly bd™ resins available from Elf Atochem, 1,4-butanediol diglycidyl ether, and resorcinol diglycidyl ether. Also useful are the cycloaliphatic epoxies, such as cyclohexene oxide and the ERL™ series of resins available from Union Carbide, such as vinylcyclohexene dioxide (ERL-4206), 3,4-epoxycyclohexylmethyl-3,4-epoxycyclohexanecarboxylate (ERL-4221), bis(3,4-epoxy-6-methylcyclohexylmethyl)adipate (ERL-4299); 1,4-butanediol diglycidyl ether, (for example, Heloxy 67™ available from Shell Chemical), polyglycidyl ether of phenol-formaldehyde novolak (e.g., DER™-431 and DER™-438, available from Dow Chemical Co., polyglycol diepoxide (e.g., DER™ 736, available from Dow Chemical Co.), and mixtures thereof as well as mixtures thereof with co-curatives, curing agents or hardeners that also are well known. Representative of these well-known co-curatives or hardeners that can be used are acid anhydrides such as nadic methyl anhydride, cyclopentanetetracarboxylic acid dianhydride, pyromellitic anhydride, cis-1,2-cyclohexanecarboxylic acid anhydride, and mixtures thereof.

Epoxy resins preferred for use in conductive adhesives are the glycidyl ether type of resins, particularly in formulations where stabilizers are present.

When preparing compositions containing epoxy monomers, hydroxy-functional materials can be added. The hydroxyl-functional component can be present as a mixture or a blend of materials and can contain mono- and polyhydroxyl containing materials. Preferably, the hydroxyl-functional material is at least a diol. When used, the hydroxyl-functional material can aid in chain extension and preventing excess crosslinking of the epoxy during curing, e.g., increasing toughness of the cured composition.

When present, useful hydroxyl-functional materials include aliphatic, cycloaliphatic or alkanol-substituted arene mono- or poly-alcohols having from about 2 to about 18 carbon atoms and two to five, preferably two to four hydroxy groups, or combinations thereof. Useful mono-alcohols can include methanol, ethanol, 1-propanol, 2-propanol, 2-methyl-2-propanol, 1-butanol, 2-butanol, 1pentanol, neopenyl alcohol, 3-pentanol, 1-hexanol, 1-heptanol, 1-octanol, 2-phenoxyethanol, cyclopentanol, cyclohexanol, cyclohexylmethanol, 3-cyclohexyl-1-propanol, 2-norbornanemethanol and tetrahydrofurfuryl alcohol.

Polyols useful in the present invention include aliphatic, cycloaliphatic, or alkanol-substituted arene polyols, or mixtures thereof having from about 2 to about 18 carbon atoms and two to five, preferably two to four hydroxyl groups.

Examples of useful polyols include 1,2-ethanediol, 1,2-propanediol, 1,3-propanediol, 1,4-butanediol, 1,3-butanediol, 2-methyl-1,3-propanediol, 2,2-dimethyl-1,3-propanediol, 2-ethyl- 1,6-hexanediol, 1,5-pentanediol, 1,6-hexanediol, 1,8-octanediol, neopentyl glycol, glycerol, trimethylolpropane, 1,2,6-hexanetriol, trimethylolethane, pentaerythritol, quinitol, mannitol, sorbitol, diethylene glycol, triethylene glycol, tetraethylene glycol, glycerine, 2-ethy-2-(hydroxymethyl)-1,3-propanediol, 2-ethyl-1,3-pentanediol, 1,4-cyclohexanedimethanol, 1,4-benzenedimethanol, and polyalkoxylated bisphenol A derivatives. Other examples of useful polyols are disclosed in U.S. Pat. No. 4,503,211.

Higher molecular weight polyols include the polyethylene and polypropylene oxide polymers in the molecular weight (Mn) range of 200 to 20,000 such as the Carbowax™ polyethyleneoxide materials available from Union Carbide, caprolactone polyols in the molecular weight range of 200 to 5,000 such as the Tone™ polyol materials available from Union Carbide, polytetramethylene ether glycol in the molecular weight range of 200 to 4,000, such as the Terathane™ materials available from DuPont, polyethylene glycol, such as PEG 200 available from Union Carbide, hydroxyl-terminated polybutadiene resins such as the Poly bd™ materials available from Elf Atochem, phenoxy resins, such as those commercially available from Phenoxy Associates, Rock Hill, S.C., or equivalent materials supplied by other manufacturers.

Cationically-polymerizable vinyl and vinyl ether monomers are also particularly useful in the practice of this invention and are described in U.S. Pat. No. 4,264,703, and such description is incorporated herein by reference.

Free-radically Polymerizable Monomers

Suitable free-radically polymerizable compounds containing at least one ethylenically unsaturated double bond, may be monomers and/or oligomers, such as (meth)acrylates, (meth)acylamides, and other vinyl compounds capable of undergoing free-radical polymerization. Such monomers and specific examples are more fully described in U.S. Pat. No. 4,985,340, and such description is incorporated herein by reference.

Such monomers include mono-, di-, or polyacrylates and methacrylates such as methyl acrylate, methyl methacrylate, ethyl acrylate, isopropyl methacrylate, isooctyl acrylate, acrylic acid, n-hexyl acrylate, 2-ethylhexyl acrylate, stearyl acrylate, allyl acrylate, glycerol diacrylate, glycerol triacrylate, ethylene glycol diacrylate, diethylene glycol diacrylate, triethylene glycol dimethacrylate, 1,3-propanediol dimethacrylate, 1,6-hexanediol diacrylate, trimethylolpropane triacrylate, 1,4-cyclohexanediol diacrylate, pentaerythritol triacrylate, -tetraacrylate and -tetramethacrylate, the bis-acrylates and bis-methacrylates of polyethylene gycols of molecular weight 200–500; multi-reactive monomers such as epoxy (meth)acrylates, isocyanatoalkyl (meth)acrylates such as isocyanatoethyl (meth)acrylate, hydroxyalkyl (meth)acrylates, such as hydroxyethyl- and hydroxypropyl (meth)acrylates, acrylated epoxies, such as ethoxylated bisphenol A di(meth)acrylate, glycidyl (meth)acrylate; unsaturated amides such as acrylamide, methylene bisacrylamide and β-methacrylaminoethyl methacrylate; and vinyl compounds such as styrene, divinylbenzene, divinyl adipate and various vinyl azlactones as are disclosed in U.S. Pat. No. 4,304,705. Mixtures of more than one monomer can be used as desired.

Acid Catalyzed Step Growth Polymerizable Monomers

Acid-catalyzed step growth polymerizations include, but are not limited to, the reaction of multifunctional isocyanates (polyisocyanates) with multifunctional alcohols (polyols) to form polyurethanes, the reaction of multifunctional epoxies with multifunctional alcohols, and the cyclotrimerization of multifunctional cyanate esters to crosslinked polytriazine resins.

Particularly useful multifunctional alcohol, isocyanate, and epoxide components that can be cured by acid-catalyzed step-growth polymerization using catalysts of the present invention are described in U.S. Pat. Nos. 4,985,340, 4,503,211 and 4,340,716, and such description is incorporated herein by reference.

Suitable multifunctional cyanate esters that can be cured by catalyzed cyclotrimerization, using catalysts of this invention are described in U.S. Pat. Nos. 5,143,785 and 5,215,860 and such description is incorporated herein by reference.

Suitable multireactive monomers that can be cured by catalysts of the invention include glycidyl (meth)acrylate, hydroxy(alkyl) (meth)acrylates such as hydroxyethyl acrylate, isocyanatoethylmethacrylate, and the like.

When mixtures of more than one polymerizable monomer are used, the polymerizable components can be present in any proportion preferably with the minor component comprising at least 1.0 wt %.

Additives and Adjuvants

Mixtures of aforementioned classes of monomers with additives such as tackifiers, hardeners, co-curatives, curing agents, stabilizers, sensitizers etc. can also be used in the polymerizable compositions of this invention. Furthermore, adjuvants, such as pigments, abrasive granules, stabilizers, light stabilizers, antioxidants, flow agents, bodying agents, flatting agents, colorants, inert fillers, binders, blowing agents, fungicides, bacteriocides, surfactants, plasticizers, and other additives as known to those skilled in the art can be added to the compositions of this invention. These can be added in an amount effective for their intended purpose, as long as they do not interfere with the polymerization of the compositions of the invention. Additionally, in compositions containing radiationsensitive catalysts or initiators it is preferable that the adjuvants do not absorb radiation to which the catalysts or initiators are responsive.

Stabilizing additives useful in compositions comprising anions of the invention include compounds having segments or central nuclei as described in formulas 3 to 7. A first class of useful stabilizing additives comprises macrocyclic compounds of Formula (3):

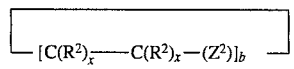 (3)

wherein $Z^2$ is divalent and can be —O—, —S—, or —NH—; each $R^2$ independently can be H or $R^1$, wherein $R^1$ can be independently selected from the group comprising $C_1$ to $C_{10}$ alkyl groups, groups of one to four fused or unfused aromatic rings, a divalent radical selected from alkylene having from 3 to 10 carbon atoms, and phenylene; further, two $R^2$s together can form a cyclic structure of 3 to 10 carbon atoms that can contain up to 10 individual, non-catenated heteroatoms selected from O, S, and N;

x can be 1 or 2; and b is an integer of from 3 to 10.

Macrocyclic complexes containing oxygen according to formula 3 are generally known as crown ethers and cryptands. In addition to oxygen, these macrocyclic compounds may also contain any combination of nitrogen or sulfur atoms. Useful macrocyclic complexes include 15-crown-5, 12-crown-4, 18-crown-6, 21-crown-7, dibenzo-18-crown-6, dicylohexyl-18-crown-6, benzo- 15-crown-5, and the like. The preferred crown ether is 15-crown-5 (1,4,7,10,13-pentaoxacyclopentadecane), available from Aldrich Chemical Co.

Another class of stabilizing additives useful in the invention can be represented by formulas (4) and (5):

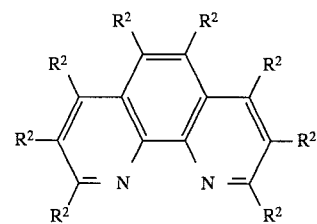 (4)

wherein $R^2$ is as defined above. Examples include substituted and unsubstituted phenanthroline compounds, wherein the most common substituents are alkyl groups having from 1 to 20 carbon atoms. The preferred phenanthroline is 1,10-phenanthroline; and

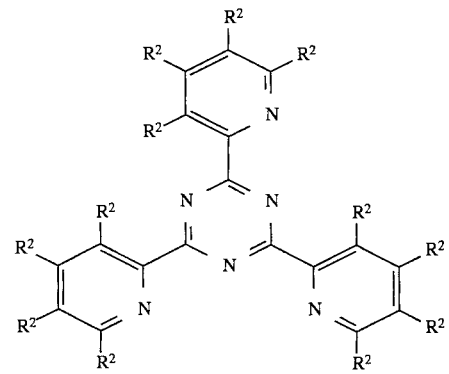 (5)

wherein $R^2$ is as defined above. Examples of this stabilizing additive include substituted and unsubstituted tripyridyltriazine compounds, preferably 2,4,6-tripridyltriazine.

A third class of stabilizing additives useful in the invention can be represented by formula (6):

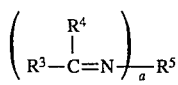

wherein
- $R^3$ is a radical moiety that can be selected from substituted and unsubstituted $C_1$ to $C_{10}$ alkyl groups, substituted and unsubstituted groups of one to four aromatic rings, wherein two to four rings can be fused or unfused rings:
- $R^4$ is hydrogen or $R^3$; when $R^4$ is $R^3$, $R^3$ and $R^4$ can be taken together to form a cyclic ring having 5 to 7 ring atoms;
- $R^5$ is $R^3$ or a divalent group (as when a=2) selected from alkylene having 2 to 10 carbon atoms and phenylene groups; and
- a is 1 or 2

These stabililzers are compounds known as Schiff bases and are generally prepared by the condensation of a ketone or aldehyde with a primary amine. They can be prepared by the general methods described in U.S. Pat. No. 4,909,954. In preferred compounds, a is 2, $R^3$ is a substituted or unsubstituted phenyl group, $R^4$ is hydrogen, and $R^5$ is a divalent bridging group such as an alkylene or phenylene group.

A fourth class of stabilizing additives useful in the invention can be represented by formula (7):

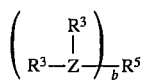

wherein
- $R^3$ and $R^5$ are as defined above:
- Z is nitrogen, phosphorous, arsenic or antimony; and
- b is 1 or 2.

Examples of this class of stabilizer include trialkyl, tricycloalkyl, tri(alkylcyloalkyl), triaryl, and trialkaryl amines, phosphines, arsines and stibines. Useful tertiary amines are described in U.S. Pat. No. 4,503,211, and such description is incorporated herein by reference. The preferred stabilizers of this class include triarylphosphines, triarylstibines, and substituted and unsubstituted dialkylaryl tertiary amines.

Examples of substituting groups that can be present on any $R^2$, $R^3$ $R^4$ or $R^5$ group, all of which preferably have less than 30 carbon atoms and up to 10 heteroatoms selected from N,S, non-peroxidic O, P, As, Se, Sb, Te, Si, Ge, Sn and B, include hydrocarbyl groups such as methyl, ethyl, butyl, dodecyl, tetracosanyl, benzyl, allyl, benzylidene, ethenyl and ethynyl; hydrocarbyloxy groups such as methoxy, butoxy and phenoxy; hydrocarbylmercapto groups such as methylmercapto and phenylmercapto; hydrocarbyloxycarbonyl groups such as methoxycarbonyl and phenoxycarbonyl; hydrocarbylcarbonyl groups such as formyl, acetyl and benzoly; hydrocarbylcarbonyloxy groups such as acetoxy and cyclohexanecarbonyloxy; hydrocarbylcarbonamido groups such as acetamido and benzamido; azo; boryl; halo groups such as chloro, bromo, iodo and fluoro; hydroxy; oxo; diphenylarsino; diphenylstibino; trimethylgermano; trimethylsiloxy; and aromatic groups such as cyclopentadienyl, phenyl, naphthyl and indenyl.

The rate of cure of compositions of the invention can be altered by adding a cure rate enhancer, such as the acid-generating esters described in U.S. Pat. No. 3,907,706, such description being incorporated herein by reference.

Preferred esters can be prepared by an esterification reacton between oxalic acid and a tertiary alkyl alcohol, e.g., t-butanol, 1,1-dimethylpropanol, 1-methyl-2-ethylpropanol, 1,1-dimethylisobutanol, 1,1-dimethyl-n-butanol, 1,1-dimethyl-n-pentanol, 1,1,2,2-tetramethylpropanol, 1,1-dimethyl-n-hexanol, 1,1-dimethyl-n-octanol, 1,1-diphenylethanol and 1,1-dibenzylethanol.

Other cure-rate enhancing compounds include peroxides, e.g., acyl peroxides such as benzoyl peroxide; alkyl peroxides such as t-butyl peroxide; hydroperoxides such as cumyl hydroperoxide; peresters such as t-butyl perbenzoate; dialkyl peroxydicarbonates such as di(sec-butyl)peroxydicarbonate; diperoxyketals; and ketone peroxides such as methylethylketone peroxide.

Optionally, it is within the scope of this invention to include photosensitizers or photoaccelerators in the radiation-sensitive compositions. Use of photosensitizers or photoaccelerators alters the wavelength sensitivity of radiation-sensitive compositions employing the latent catalysts and initiators of this invention. This is particularly advantageous when the latent catalyst or initiator does not strongly absorb the incident radiation. Use of photosensitizers or photoaccelerators increases the radiation sensitivity, allowing shorter exposure times and/or use of less powerful sources of radiation. Any photosensitizer or photoaccelerator may be useful if its triplet energy is at least 30 kilocalories per mole. Examples of such photosensitizers are given in Table 2-1 of the reference Steven L. Murov, *Handbook of Photochemistry*, Marcel Dekker Inc., N.Y., 27–35 (1973), and include those described in U.S. Pat. No. 4,985,340, and such description is incorporated herein by reference. When present, the amount of photosensitizer or photoaccelerator used in the practice of the present invention is generally in the range of 0.01 to 10 and preferably 0.1 to 1.0 wt % of photosensitizer or photoaccelerator based on the weight of the curable composition.

Addition of a silane coupling agent is optional in the preparation of cured compositions of the invention. Preferably the silane coupling agent is added to the adhesive polymerizable composition when the substrate surface is glass, an oxide, or any other surface that would benefit from the addition of a silane coupling agent. When present, a silane coupling agent contains a functional group that can react with the epoxy resin, e.g., 3-glycidoxypropyltrimethylsilane.

Conductive particles are used in the preparation of conductive adhesives of the invention by providing multiple discrete interconnections for each circuit trace. Conductive particles should be sized and loaded in accordance with the end use application, as is explained in U.S. Pat. No. 5,362,421, incorporated herein by reference. Examples of useful particles include metallized plastic spheres, solid metal particles, precious metal-coated particles, solid particles and graphite powders. Factors such as particle size, metallurgy, and hardness of the substrate can be used to select the particle type for a given application.

Solvents, preferably organic, can be used to assist in dissolving the curing agent in the polymerizable monomers described supra and as a processing aid. Representative solvents include acetone, methyl ethyl ketone, cyclopentanone, methyl cellosolve acetate, methylene chloride, nitromethane, methyl formate, acetonitrile, gamma-butyrolactone, 1,2-dimethoxyethane (glyme), 3-methyl sulfolane, and propylene carbonate. In some applications it may be advantageous to adsorb the curing agents onto an inert support such as silica, alumina, clays, etc., as described in U.S. Pat. No. 4,677,137.

In general, energy-induced polymerization of the polymerizable compositions of this invention, which incorporate a latent, light or radiation sensitive catalyst or initiator, may be carried out at room temperature for the majority of energy curable compositions, although low temperature (e.g., −10° C.) or elevated temperature (e.g., 30° to 400° C., preferably 50° to 300° C.) can be used to subdue the exotherm of polymerization or to accelerate the polymerization, respectively. Temperature of polymerization and amount of catalyst will vary and be dependent on the particular curable composition used and the desired application of the polymerized or cured product. The amount of curing agent (catalyst or initiator) to be used in this invention should be sufficient to effect polymerization of the monomers (i.e., a catalytically effective amount) under the desired use conditions. Such amount generally will be in the range of about 0.01 to 20 wt %, and preferably 0.1 to 10 wt %, based on the weight of the curable composition. For purposes of this calculation, "curable composition" means the composition including all monomers, activators/initiators, additives, adjuvants, sensitizers and other non-solvent components of the polymerization mixture.

Energy Sources

For those initiator/curative compositions of the invention that are radiation sensitive, any source of radiation including accelerated particles (e.g., electron beam radiation) and radiation sources emitting active radiation in the ultraviolet and visible region of the spectrum (e.g., about 200 nm to 800 nm) can be used. Suitable sources of radiation include fluorescent lamps, mercury vapor discharge lamps, carbon arcs, tungsten lamps, xenon lamps, lasers, sunlight, etc. The required amount of exposure to effect polymerization is dependent upon such factors as the identity and concentrations of the curing agent, the particular monomers, the temperature and thickness of the exposed material, type of substrate, intensity of the radiation source and the amount of heat associated with the radiation.

For those initiator/curative compositions of the invention that are thermally sensitive, any source of thermal energy known in the art may be used. Suitable sources of thermal energy include direct heating, induction heating, infrared or microwave electromagnetic radiation, and lasers or laser diodes.

It has been noted that certain catalysts and photocatalysts of the present invention, particularly those comprising a tris(fluoroalkylsulfonyl) methide counterion, can provide exceptionally strong catalytic activity when activated as compared to other commonly known and well regarded catalyst and photocatalyst systems. This is particularly true where monomers polymerizable by cationic addition polymerization or acid-catalyzed step-growth polymerization are used.

Applications and Uses

Compositions of this invention may be applied, preferably as a liquid, to a substrate such as steel, aluminum, copper, cadmium, zinc, ceramic, glass, paper, wood or various plastic films such as poly(ethyleneterephthalate), plasticized poly(vinylchloride), polypropylene, polyethylene, polyimide, and the like, and irradiated or heated. By polymerizing part of the coating, as by irradiation through a mask, those sections that have not been exposed may be washed with a solvent to remove the unpolymerized portions while leaving the photopolymerized, insoluble portions in place. Thus, compositions of this invention may be used in the production of articles useful in the graphic arts and electronics industries, such as printing plates and printed circuits from photopolymerizing compositions are well known in the art (cf., British Patent Specification No. 1,495,746).

Compositions of this invention are useful for coatings, foams, shaped articles, adhesives (including structural and semistructural adhesives), magnetic media, filled or reinforced composites, coated abrasives, caulking and sealing compounds, casting and molding compounds, potting and encapsulating compounds, impregnating and coating compounds, conductive adhesives for electronics, protective coatings for electronics, and other applications that are known to those skilled in the art.

To prepare a coated abrasive article using the materials of the present invention, abrasive particles must be added to the curable composition. The general procedure is to select a suitable substrate such as paper, cloth, polyester, etc., coat this substrate with the make coat that consists of the curable composition containing the abrasive particles, and then curing by the application of a source of energy. A size coat, which cures to a harder material than the make coat, is then coated over the make coat and cured. The size coat serves to lock the abrasive particles in place.

To prepare a structural/semi-structural epoxy adhesive, the curable composition could contain additional adjuvants such as silica fillers, glass bubbles and tougheners. These adjuvants add toughness to and reduce the density of the cured composition. Generally shorter chain polyols would be used to give toughness through chain extension of the cured epoxy. Too long a chain diol generally would produce too soft a cured composition that would not have the strength needed for structural/semi-structural applications. Using polyols having high hydroxyl functionality (e.g., greater than three) could produce an overcrosslinked material resulting in a brittle adhesive.

To prepare magnetic media using the materials of the present invention, magnetic particles must be added to the curable composition. Magnetic media need to be coated onto a suitable substrate, generally a polymeric substrate like polyester. Generally the coatings are very thin so that sufficient carrier solvent must be added to allow the production of a suitably thin, even coating. The coating must cure rapidly so a fast initiator system and curable materials must be chosen. The cured composition must have a moderately high modulus so the curable materials must be selected appropriately.

To prepare protective coatings, the choice of materials depends on the needs of the specific application. Abrasion resistant coatings are generally hard and require a significant portion of the formulation to be a hard resin, which are generally short chain length and have high functionality. Coatings undergoing some flex require toughness which can be obtained by lowering the crosslink density of the cure formulation. Clear coatings require the cured resins to have little to no phase separation. This obtained by controlling the compatibility of the resins or controlling phase separation by cure rate. Adjuvants could be added to these coating formulations in an amount effective for their intended use.

In the electronics sector, there is a trend towards products containing as little as possible free or hydrolyzable halogen, which can lead to corrosion of various critical components. Energy-activatable curatives known in the art contain complex metal- or non-metal halide anions from which halogen can be split off by hydrolysis, such as, e.g., $SbF_6^-$, $PF_6^-$, $BF_4^-$, etc. Anions of the present invention are unique in their stability to hydrolysis or other post-cure reactions that may liberate halogen ions, yet retain the fast curing, non-coordinating and non-nucleophilic characteristics desirable in such catalysts.

As stated, the noncorrosive nature of these anions is especially suited to uses in the electronics sector, for example in general adhesives, conductive adhesives, potting and encapsulating materials applications. For conductive adhesives, the curable composition is filled with conductive particles to the level that there is conduction through the adhesive between the desired contact points. One class of conductive adhesives is often referred to as "z-axis adhesives" or as "anisotropically conductive adhesives" where the adhesive is filled with conductive particles to the level that there is conduction between contact points in the z-axis but not the x-y plane of the adhesive. Such z-axis adhesives are often produced as a thin film adhesive on a carrier substrate, such as a polymer film. A description of materials suitable for z-axis adhesives is disclosed in U.S. Pat. No. 5,362,421.

Because conductive particles provide multiple discrete interconnections for each circuit trace, the conductive particles are generally sized and loaded in accordance with the end use application, as is described in U.S. Pat. No. 5,362,421. Examples of useful particles include metallized plastic spheres, incorporated herein by reference for its description of the adhesives, their method of preparation, the monomer constituents thereof, and the conductive and adjuvant constitutents thereof.

Addition of a hydroxyl-functional material is optional in the preparation of conductive adhesives. When the thermoplastic resin contains a high degree of hydroxyl functionality, such as with phenoxy and novolac resins, it is preferable not to use any hydroxyl-functional materials.

In the preparation of conductive adhesives, a thermoplastic resin may be added to the curable composition to impart the proper handling characteristics. For a poring or encapsulating material, the composition generally does not contain conductive particles. For all of these applications, the catalyst and additional curing agents would be selected to obtain the cure rate and the cure temperature appropriate for the specific application.

The objects, features and advantages of the present invention are further illustrated by the following examples, but the particular materials and amounts thereof recited in these examples, as well as other conditions and details, should not be construed to unduly limit this invention. All materials are commercially available or known to those skilled in the art unless otherwise stated or apparent.

EXAMPLES

Energy-activatable compounds of the present invention can be conveniently prepared by combining the desired cationic species with the desired anionic species in a metathesis reaction.

EXAMPLE 1

Synthesis of $HC(SO_2CF_3)_3$

A 90.2 g sample of $Cs^+\bar{C}(SO_2CF_3)_3$, prepared essentially as described in Example 18 and was purified by recrystallization from 2.9 L of water and dried at 140° C in vacuo yielding 78.5 g. The anhydrous, white, crystalline solid was combined with ca. 90 mL of vacuum-degassed, 100% $H_2SO_4$ in a sublimation apparatus equipped with a water-cooled condenser and a magnetic stirrer. Distillation of $HC(SO_2CF_3)_3$ from the sulfuric acid mixture was carried out at 65° C., $10^{-3}$ Torr for 3 days providing 49.5 g of a solid, white condensate. The condensate was collected in a nitrogen-filled drybox to avoid exposure to moisture and then resublimed, without added sulfuric acid, at 50°–55° C., $10^{-3}$ Torr for ca. 2 hours to yield ca. 44 g of crystalline $HC(SO_2CF_3)_3$ of high purity. The corrosive product was stored in a nitrogen-filled drybox at −30° C. in an FEP bottle (available from Nalgene, Inc., Chicago, Ill.) to prevent contamination by moisture and metals.

EXAMPLE 2

Synthesis of $(CH_3C_6H_4)_2I^+\bar{C}(SO_2CF_3)_3$

Into a 2 liter 3-necked round botttom flask equipped with a mechanical stirrer, thermometer, and inlet was charged 230 g potassium iodate, 400 g toluene and 360 mL acetic anhydride, with constant stirring. The mixture was cooled to −15° C. and treated with 326 g trifluoromethanesulfonic acid dropwise at a rate so as to maintain the temperature below 5° C., over 2.5 hours. After stirring for 4 hours at 0° C., the mixture was allowed to stir at room temperature overnight, then cooled again to 0° C. and treated with 537 mL water at a rate such that the temperature was kept below 10° C. Dichloromethane (500 mL) was added and the mixture was stirred for 30 minutes to allow for phase separation. The dichloromethane phase was collected, and an additional 500 mL dichloromethane was stirred with the remaining aqueous phase for 30 minutes, allowed to separate, and collected. The combined dichloromethane phases were concentrated in vacuo at 40° C. to give a brown liquid. Stirring the liquid with 400 mL isopropyl ether for one hour gave a solid that was collected by filtration and washed on the filter with an additional 800 mL isopropyl ether. The solid was dissolved in isopropyl alcohol heated to 82° C. and the solution diluted with 460 mL hexane, then cooled to 0° C. The resulting solid was again collected by filtration and washed with a mixture of 300 mL hexane and allowed to air dry to give 214 g of a white solid, m.p. 110°–127° C., identified as ditolyliodonium trifluoromethane sulfonate, $(CH_3C_6H_4)_2I^+\bar{O}_3SCF_3$.

Approximately 400 mL of a 1.0 molar aqueous solution of $Li^+\bar{C}(SO_2CF_3)_3$, prepared according to Example 18 was combined with 89.2 g of $(CH_3C_6H_4)_2I^+\bar{O}_3SCF_3$ in 400 mL methylene chloride. The mixture was stirred vigorously overnight in the dark and then transferred to a seperatory funnel where the aqueous phase was separated and discarded. The methylene chloride phase was extracted with 350 mL of water, separated and dried overnight with anhydrous aluminum oxide. The mixture was filtered by suction and the filtrate evaporated at 60°–80° C., 20 turn to a give a clear colorless oil that gradually crystallized (white needles) upon cooling to room temperature. Quantitative analysis by $^1H$ and $^{19}F$ NMR spectroscopy indicates that the product is 99.5% $(CH_3C_6H_4)_2I^+\bar{C}(SO_2CF_3)_3$ by weight.

EXAMPLE 3

Synthesis of $HC(SO_2C_4F_9)_3$

A dry, nitrogen-purged flask equipped with a water-cooled condenser, addition funnel, mechanical stirrer, thermocouple probe and nitrogen inlet was charged with 173 mL 3M $CH_3MgCl$. While maintaining a nitrogen atmosphere, $C_4F_9SO_2F$ (83 mL), prepared according to the method of Example 1 of U.S. Pat. No. 3,423,299 which had been previously purified by washing with 8% $K_2CO_3(aq)$, filtration through activated silica gel and fractional distillation, was slowly added from the addition funnel at a rate of ca. 0.5 mL/min with rapid stirring. This reaction was exothermic causing reaction temperature to rise to ca. 40° C. during early stages. After approximately ¾ of $C_4F_9SO_2F$ was added and reaction exotherm had diminished, the oil bath was heated to 65° C. $C_4F_9SO_2F$ addition was continued at ca. 0.5 mL/min until the entire 83 mL was added. Once addition was complete, the reaction mixture was stirred and heated in a 65° C. oil bath for an additional 44.5 hours to drive the reaction to completion. Most of the unreacted $C_4F_9SO_2F$ was removed in vacuo by applying aspirator vacuum to the flask at 25°–70° C. with mechanical stirring until the solution became too viscous to stir. The residue was transferred to a 1 liter r.b. flask by rinsing the kettle with 2×100 mL portions of fresh THF (tetrahydrofuran). The THF solution was evaporated at 70° C., 20 mm to remove all volatiles. The remaining solid residue was combined with 200 mL of 5M sulfuric acid and mixed well. The aqueous acid mixture was cooled in an ice water bath and then extracted with 2×225 mL portions of i-Pr$_2$O. The dark brown ether extracts were combined and rotovapped at 40° C., 20 mm until most of solvent was removed. What remained was a dark brown oil containing the crude $(C_4F_9SO_2)_3CH$ product. The oil was suspended in 500 mL of water to give a 2-phase mixture (lower phase-dk brown semisolid oil; upper phase-lt. yellow soln). The aqueous mixture was distilled to remove volatile $H_2C(SO_2C_4F_9)_2$ byproduct that codistills with water, while adding an additional 750 mL of water to the pot in portions to make up for the volume of water lost in the distillation. After collecting a total of 925 mL of distillate, the remaining aqueous mixture in the still pot was extracted with 2×150 mL portions of $CH_2Cl_2$. The combined methylene chloride extracts were treated with a concentrated solution of $Cs_2CO_3$ in water with rapid stirring yielding a dark brown precipitate that was filtered by suction. The isolated precipitate was washed with 2 portions of water, 2 portions of toluene and one final portion of methylene chloride. Drying in vacuo at $10^{-3}$ Torr, 120° C. for ca. 6 hrs with a dry ice trap yielded 44.566 g of cesium salt. $^1H$ and $^{19}F$ NMR spectroscopy of this solid indicated that it contained greater than 95 mole % $Cs^+$ $^-C(SO_2C_4F_9)_3$. The cesium salt was combined with 45 mL of degassed, 100% $H_2SO_4$ in a sublimation apparatus equipped with a magnetic stirrer and a water-cooled condenser. The product, $HC(SO_2C_4F_9)_3$, was distilled at 65°–75° C., $10^{-3}$ Torr and collected as a solid on the condenser. The solid condensate was resublimed, without added $H_2SO_4$, at 65°–70° C., $10^{-3}$ Torr to give 21.3 g of a white crystalline solid identified as $(C_4F_9SO_2)_3CH$ by NMR analysis of the corresponding lithium salt derived from this material by reaction with LiOH. Both the methide acid and its lithium salt can be a precursor to catalysts of the invention.

EXAMPLE 4

This example illustrates the advantageous properties of diaryliodonium tris(fluoroalkylsulfonyl)methide salts compared to diaryliodonium salts of art-known anions for the photoinitiated, cationic polymerization of cyclohexene oxide.

Each of the iodonium salts in the table below was combined with 2 mL of cyclohexene oxide at room temperature to yield solutions containing approximately equal weight percent concentrations of photoinitiator. Uncapped glass vials containing the freshly prepared solutions were arranged between the two 15 Watt black-light bulbs (Sylvania F 15T8/350BL) of an inverted fluorescent lamp fixture. The lamp was turned on and the irradiation time required to initiate polymerization was measured. Onset of polymerization was indicated by the exotherm produced when cyclohexene oxide begins to react; for the most reactive initiators this polymerization is so vigorous that the heat generated literally propels the contents of the vial into the air like an erupting volcano. Irradiation was terminated after 60 seconds, but the samples were observed for an additional 2 hours at room temperature for any evidence of post-curing. The results are summarized in Table 1.

TABLE 1

| Photoinitiator | Wt % in cyclohexene oxide | Cure Time (sec) | Observations |
|---|---|---|---|
| $(CH_3C_6H_4)_2I^+$ $^-C(SO_2CF_3)_3^{(a)}$ | 1.1 | 6 | Violent Exotherm "Volcano" |
| $(C_6H_5)_2I^+$ TFPB$^{-(b)}$ (Comparative) | 1.2 | 24 | Violent Exotherm "Volcano" |
| $(CH_3C_6H_4)_2I^+$ $PF_6^{-(c)}$ (Comparative) | 1.2 | >60 | Warm after irradiation, but still liquid after 2 hrs @ RT |
| $(CH_3C_6H_4)_2I^+$ $^-O_3SCF_3^{(a)}$ (Comparative) | 1.1 | >60 | No cure or exotherm |
| $(C_6H_5)_2I^+$ SbF$_6^{-(c)}$ (Comparative) | incomplete solubility | >60 | No cure or exotherm |

$^{(a)}$prepared according to Example 2
$^{(b)}$prepared according to WO 95/03338; TFPB$^-$ = tetrakis(3,5-bis-trifluoromethylphenyl)borate
$^{(c)}$prepared according to the method described in Example 3 of U.S. Pat. No. 3,981,897.

Of the photoinitiators tested, $(CH_3C_6H_4)_2I^{+-}C(SO_2CF_3)_3$ was by far the most reactive. Even the TFPB$^-$ salt exhibited cure times that were a factor of 4 longer than the methide salt. Importantly, the methide salt was much more reactive than either the triflate or the $PF_6^-$ salts, even though the relative molar concentration of the methide salt in solution was approximately half. Furthermore, the incomplete solubility of the SbF$_6^-$ salt and its consequent lack of reactivity illustrated the solubilizing effect of the methide anion and the advantage such solubility accords.

EXAMPLE 5

This example illustrates the advantageous properties of ammonium methide salts for acid catalyzed curing of epoxyalcohol mixtures compared to analogous ammonium salts containing different art known counteranions.

Dialkylbenzocanium salts were prepared by art-known metatheses reactions wherein an aqueous solution of amine hydrochloride was treated with a lithium salt of the anion. Typically, the desired ammonium salt precipitates from the aqueous medium. Dialkylanilinium salts were prepared by art-known metatheses reactions wherein a neutral amine and the acid form of the anion are stirred in an aqueous methanol solution. On stripping the methanol solvent, the desired salt is obtained and worked up by standard procedures.

The following general procedure was followed for screening the ammonium salts as acid catalysts for epoxy/polyol mixtures. Mixtures of DGEBA epoxy (EPON 828, Shell) and ethylene oxide chain-extended, bisphenol A type polyols (SYN FAC 8024, Milliken) with a ratio of epoxide:hydroxide of 1:0.4 were cured using 1 weight percent (based on total weight of monomers) of catalyst salt. The catalyst salt (0.020 g) was dissolved/suspended in 0.588 g of the polyol SYN FAC 8024 (epoxy equivalent weight 180). This mixture was added to 1.412 g of the epoxy EPON 828 (epoxide equivalent weight 185–192). A small aliquot (10–20 mg) was removed and placed in an aluminum pan and differential scanning calorimetry (DSC) was carried out on a Perkin Elmer DSC7 instrument with a heating rate of 10° C/minute. DSC data for these salts is summarized in Table 2 and Table 3 for diethylanilinium and benzocainium salts, respectively.

TABLE 2

DSC Data for Diethylanilinium Salts

| Catalyst Salt | $T_{peak}$ (°C.) | $T_{onset}$ (°C.) | Exotherm (J/g) |
|---|---|---|---|
| [N,N-Diethylanilinium][SbF$_6$] (Comparative) | | | |
| peak 1 | 69 | 48 | −20.8 |
| peak 2 | 151 | 127 | −16.3 |
| peak 3 | 231 | 192 | −86.6 |
| [N,N-Diethylanilinium][BPh$_4$] (Comparative) | 96 | 78 | −21.5 |
| [N,N-Diethylanilinium][TFPB] (Comparative) | 155 | 118 | −415.5 |
| [N,N-Diethylanilinium][Methide] | 134 | 100 | −375.6 |
| [N,N-Diethylanilinium][Imide] | 210 | 184 | −341.4 |

TABLE 3

DSC Data for Benzocainium Salts

| Catalyst Salt | $T_{peak}$ (°C.) | $T_{onset}$ (°C.) | Exotherm (J/g) |
|---|---|---|---|
| [p-H$_3$N(C$_6$H$_4$)CO$_2$ME][SbF$_6$] (Comparative) | | | |
| Peak 1 | 93 | 63 | −190.9 |
| Peak 2 | 177 | 151 | −49.9 |
| [o-H$_3$N(C$_6$H$_4$)CO$_2$Me][SbF$_6$] (Comparative) | 88 | 63 | −191.3 |
| [p-H$_3$N(C$_6$H$_4$)CO$_2$Me][BPh$_4$] (Comparative) | 87 | 51 | −17.3 |
| [o-H$_3$N(C$_6$H$_4$)CO$_2$Me][BPh$_4$] (Comparative) | 93 | 46 | −39.4 |
| [p-H$_3$N(C$_6$H$_4$)CO$_2$Me][TFPB] (Comparative) | 103 | 72 | −304.0 |
| [o-H$_3$N(C$_6$H$_4$)CO$_2$Me][TFPB] (Comparative) | 88 | 56 | −319.7 |
| [p-H$_3$N(C$_6$H$_4$)CO$_2$Me][Methide] | 91 | 78 | −367.1 |
| [o-H$_3$N(C$_6$H$_4$)CO$_2$Me][Methide] | 80 | 58 | −300.7 |
| [p-H$_3$N(C$_6$H$_4$)CO$_2$Me][Imide] | 87 | 62 | −7.9 |
| [o-H$_3$N(C$_6$H$_4$)CO$_2$Me][Imide] | | | |
| Peak 1 | 68 | 48 | −35.6 |
| Peak 2 | 228 | 199 | −307.7 |

Methide = $^-C(SO_2CF_3)_3$; Imide = $^-N(SO_2CF_3)_2$; BPh$_4$ = tetraphenylborate; TFPB = tetrakis(3,5-bis(trifluoromethyl)phenyl)borate DSC data shows that the TFPB and the methide salts had the highest activity. Imide salts are less useful with the particular cations of the Example because they either had a high activation temperature or a low overall energy of reaction. Compared to the SbF$_6$ and the BPh$_4$ salts, the methide and TFPB salts have much larger overall exotherms and also the desired low activation temperatures. Although the TFPB and the methide anions provided comparable performance, the cost of the former is prohibitive for most commercial applications. Therefore the methide salts provided the best balance of cost and performance.

EXAMPLE 6

Preparation of Ph$_2$IC(SO$_2$CF$_3$)$_3$.

To a mixture of 100 ml of water and 100 ml of methylene chloride in a 250 ml Erlenmeyer flask was added 2.5 g of diphenyliodonium chloride (available from Aldrich Chemical Co.) and 3.3 g of Li$^+$$^-$C(SO$_2$CF$_3$)$_3$ (Example 18). The mixture was stirred vigorously. It began to clear after about one hour of stirring. The stirring was continued for approximately 16 hours. After this duration of time, the stirring was stopped and the solution placed in a separatory funnel, the methylene chloride layer was saved and washed with 2×100 ml portions of salt water, the methylene chloride layer was dried over CaSO$_4$, filtered, then crystallized from methylene chloride and heptane. The white solid obtained from this procedure was dried overnight in a vacuum oven at 45° C., yield 5.0 g. The product was identified by $^1$H and $^{13}$C NMR.

EXAMPLE 7

PhotoDSC Tests comparing Ph$_2$IC(SO$_2$CF$_3$)$_3$ and Ph$_2$ISbF$_6$

A stock solution of 0.5 g 2-ethyl-9,10-dimethoxyanthracene (Aldrich Chemical Co.) dissolved in 50 g of 3,4-epoxycyclohelxylmethyl-3,4-epoxycyclohexane carboxylate, commercially available as ERL-4221 from Union Carbide was prepared. Test solutions were prepared from this stock solution as follows: a mixture of ca 0.05 g gamma-butyrolactone and the appropriate amount of catalyst was mixed in an aluminum pan, and treated with 2.0 g stock solution with thorough mixing.

The weights of the iodonium salts were adjusted to give an equal number of moles of both catalysts, 0.032 g Ph$_2$IC(SO$_2$CF$_3$)$_3$ (Example 6) or 0.024 g Ph$_2$ISbF$_6$ (Example 4). PhotoDSC tests were run as follows: A DuPont 930 Differential Photocalorimeter was used to carry out PDSC measurements on initiator-epoxy solutions. Approximately 5 mg of test solution was weighed into a standard aluminum pan, and the pan was placed in the PDSC chamber. An empty pan was used as the reference and was also placed in the PDSC chamber. The chamber was covered with a quartz window and was equilibrated to the stated temperature under a nitrogen purge. The chamber was photolyzed for 5 minutes with a 200 Watt mercury arc lamp controlled by the calorimetry unit. The DuPont 2100 Thermal Analyst program was used in data analysis. The induction time, time to peak maximum and total energy were recorded. The results are presented in Table 4.

TABLE 4

PhotoDSC Results

| Catalyst | Temperature, °C. | Energy J/g | Induction Time, sec | Peak Maximum, sec |
|---|---|---|---|---|
| Ph$_2$IC(SO$_2$CF$_3$)$_3$ | 25 | 46 | 9.9 | 34.4 |
| Ph$_2$ISbF$_6$ (Comparative) | | 57 | 8.9 | 29 |
| Ph$_2$IC(SO$_2$CF$_3$)$_3$ | 50 | 179 | 8.8 | 27.2 |
| Ph$_2$ISbF$_6$ (Comparative) | | 183 | 8.1 | 24 |
| Ph$_2$IC(SO$_2$CF$_3$)$_3$ | 75 | 335 | 7.6 | 20 |
| Ph$_2$ISbF$_6$ (Comparative) | | 332 | 7.1 | 18.8 |
| Ph$_2$IC(SO$_2$CF$_3$)$_3$ | 100 | 417 | 5.6 | 15.2 |
| Ph$_2$ISbF$_6$ (Comparative) | | 407 | 5.6 | 15.2 |
| Ph$_2$IC(SO$_2$CF$_3$)$_3$ | 125 | 504 | 3.9 | 7.6 |
| Ph$_2$ISbF$_6$ (Comparative) | | 467 | 4 | 8.4 |

The data in this table show that the anions of the present invention were comparable in cure rate and extent of cure to SbF$_6^-$, generally recognized as the most reactive anion in current use.

EXAMPLE 8

Preparation of (n$^6$-mixed xylenes)(n$^5$-cyclopentadienyl)iron(+1) $^-$C(SO$_2$CF$_3$)$_3$ ("CpM", Table 5).

In a one liter reaction kettle fitted with a nitrogen purge inlet and condenser, were added first, 300 ml of mixed xylenes, 25 g of ferrocene (Aldrich Chemical Co., Milwaukee, Wis.) and 3.63 g of aluminum powder, then 54 g of aluminum chloride and finally 2.5 ml of water. The reaction mixture was mechanically stirred at room temperature for about one hour, then the temperature was raised to 60° C. then finally to 120° C. The reaction mixture was held at 120° C for four hours. The reaction mixture was allowed to cool to room temperature, further cooled in an ice/water bath, then 150 mL of ethanol was added with stirring. The solution was allowed to warm to room temperature and 200 mL of water was added. A separatory funnel was used to separate off the water layer, and the water layer was washed with minutes; samples 10C (comparative example) and 10D were cured in an oven at 140° C. for 30 minutes after irradiation under black lights at 354 nm for 2.5 minutes. Example 10E (control) was also heated in the oven at 140° C. for 30 minutes.

After curing, the coating was scraped from the glass plates and cryoground, then extracted with ultrapure water at 95° C. The extract was analyzed in duplicate by ion chromatography for fluroide and chloride ion content. The results are shown in Table 5.

TABLE 5

| Sample | Catalyst | | | | TAO, g | Phenan., g | F⁻, ppm | Cl⁻, ppm |
| | CpS | CpM | MesS | MesM | | | | |
| --- | --- | --- | --- | --- | --- | --- | --- | --- |
| 10A comparative | | | 0.062 | | 0.066 | 0.011 | 510/602 | 0.2/0.6 |
| 10B | | | | 0.061 | 0.060 | 0.010 | 0.6/0.7 | 1/2 |
| 10C comparative | 0.060 | | | | 0.060 | | 355/513 | nd/13 |
| 10D | | 0.065 | | | .060 | | 1/1 | 1/nd |
| 10E control | | | | | | | 8/2 | 11/25 |

CpS = CpFeXySbF$_6$($\eta^5$-cyclopentadienyl)$\eta^6$-mixed xylenes)FeSbF$_6$
CpM = CpFeXyM($\eta^5$-cyclopentadienyl)($\eta^6$-mixed xylenes)FeC(SO$_2$CF$_3$)$_3$ (Example 8)
MesS = ($\eta^6$-mesitylene)$_2$Fe[SbF$_6$]$_2$
MesM = ($\eta^6$-mesitylene)$_2$Fe[C(SO$_2$CF$_3$)$_3$]$_2$ (Example 9)
nd = not detected toluene three times, about 200 mL each, and then with petroleum ether two times, about 200 mL each. To this water layer was added 30 g of LiC(SO$_2$CF$_3$)$_3$ (Example 18) as a solid. This produced an oil that was extracted from the water with methylene chloride. The methylene chloride layer was separated, dried with CaSO$_4$, filtered and the solvent removed under reduced pressure. The dark oil was pumped on overnight in a vacuum oven at 45° C., yield 29.5 g. The material was identified by $^1$H, $^{13}$C and $^{19}$F NMR.

EXAMPLE 9

Preparation of (n$^6$-mesitylene)$_2$ iron (+2)[C(SO$_2$CF$_3$)$_3$]$_2$ ("MesM" of Table 5)

The title methide salt of the bis-arene iron dication was prepared by the method of J. F. Helling, S. L. Rice, D. M. Braitsch and T. J. Mayer, *J. Chem. Soc., Chem. Comm.* 1971, 930, substituting lithium methide (Example 18) for ammonium hexafluorophosphate. The compound was identified by $^1$H and $^{13}$C NMR.

EXAMPLE 10

Preparation and testing of adhesive formulations

A stock solution of 120 g electronic grade diglycidyl ether of Bisphenol A (RSL 1462, available from Shell Chemicals) and 80 g of phenoxy resin (PKHC, available from Phenoxy Associates, Rock Hill, S.C.) in 200 g methyl ethyl ketone (MEK) was prepared. Individual adhesive samples 10A–10E were prepared by taking 20 g of the stock solution and mixing it with each of the catalysts and additives shown in Table 5. Di-t-amyl oxalate (TAO) was added as an accelerator and 1,10-phenanthroline (phenan) was added as a stabilizer for the adhesive compositions.

Five glass plates (30.5×45.7 cm) previously cleaned with MEK were coated with each of the adhesive formulations using a #75 Mayer bar. The samples were air dried and protected from the light. Examples 10A (comparative example) and 10B were cured in an oven at 140° C. for 30

The data of Table 5 show that both adhesive resins prepared with the methide anion of the invention contained levels of extractable fluoride that were significantly lower than those from adhesives prepared using known SbF$_6^-$ anions. The methide anion offered a distinct advantage over SbF$_6^-$ and related metalfluoride non-coordinating anions (e.g., PF$_6^-$, AsF$_6^-$, BF$_4^-$) where fluoride-induced corrosion was a concern, and it is reasonable to expect that, in conjunction with other cations, such as onium cations, the inventive anions would provide non-corrosive catalyst systems.

EXAMPLE 11

Preparation of Cp$_2$FeC(SO$_2$CF$_3$)$_3$ 1.05 g of ferrocene and 0.30 g benzoquinone were combined in a 250 ml flask. 75 ml of toluene and 20 ml of isopropanol were added, the mixture stirred until all the solid dissolved then the solution was filtered into a 125 mL Erlenmeyer flask. The solution was purged with nitrogen for 15–20 minutes and then 2.0 g of HC(SO$_2$CF$_3$)$_3$ (Example 1) was added. Then solution was stirred for an additional 30 minutes while under a nitrogen purge. The solid blue product that was formed was filtered off, washed with isopropanol, toluene and petroleum ether and dried on the filter under a flow of air. The yield was 2.3 g. The materials was identified by infrared (IR) spectroscopy. The activity of this product was verified by adding it to cyclohexene oxide, which polymerized rapidly and exothermically.

This procedure was used to also prepare Cp$_2$FeN(SO$_2$CF$_3$)$_2$, Cp$_2$FeHC(SO$_2$CF$_3$)$_2$, Cp$_2$FeSO$_3$CF$_3$ and Cp$_2$FeSbF$_6$ by substituting the corresponding acid for HC(SO$_2$CF$_3$)$_3$ in the preceding method.

EXAMPLE 12

The purpose of this example is to compare the physical properties of epoxy/polyol compositions cured using Cp$_2$Fe$^+$ salts with various counterions. A stock solution of EPON 828/PEG 200, 25% polyol was prepared. The catalysts used were $Cp_2FeSbF_6$, $Cp_2FeTFPB$, $Cp_2Fe(CF_3SO_2)_2CH$, $Cp_2FeC(SO_2CF_3)_3$, $Cp_2FeN(CF_3SO_2)_2$ and $Cp_2FeCF_3SO_3$.

$HN(SO_2CF_3)_2$ was isolated by distillation from a mixture of concentrated sulfuric acid and $LiN(SO_2CF_3)_2$, obtained from the 3M Company as "HQ-115." $H_2C(SO_2CF_3)_2$ was prepared according to the method of Example 1 of U.S. Pat. No. 3,776,960. Trifluoromethanesulfonic acid ($CF_3SO_3H$) was obtained from Aldrich Chemical Co.

$Cp_2FeTFPB$ was prepared by dissolving 0.989 g of ferrocene and 0.287 g of benzoquinone in 150 mL, of ethanol. The solution was purged for 15 minutes with nitrogen. While stirring and purging, 0.194 g of concentrated HCl was added to the ethanol solution. An immediate reaction took place and a deep blue color formed. A solution of 5.0 g NaTFPB•$3H_2O$ (sodium tetrakis[3,5-bis(trifluoromethyl)phenyl] borate, prepared according to the method of H. Kobayashi et al., *Bull. Chem. Soc. Japan*, 57, 2600, 1984) in 300 ml water and 50 ml ethanol was prepared and purged with nitrogen. The product of the first solution was added to the NaTFPB solution. A blue precipitate formed and was filtered off, washed with ethanol and dried in a vacuum oven. The yield was 3.90 g of $Cp_2FeTFPB$.

Each test mixture was prepared in the following manner: 0.15 g of catalyst and 0.30 g gamma-butyrolactone were combined in a jar and the catalyst was allowed to dissolve. 30 g of the epoxy/polyol composition was added, mixed thoroughly and the jar was placed in a water bath set at 60° C. to eliminate any bubbles.

The individual tensile test samples were prepared in the following manner: molds were prepared from 0.78 mm thick silicone rubber sheets using a Type IV ASTM 638 die cutter. The molds were placed on a piece of silicone release liner on an aluminum plate, release side up, and the molds were partially filled, taking care to avoid bubbles. A second piece of release liner was placed on top of the mold and a rubber roller was used to smooth out the sample.

The cure cycle for all samples was: 30 minutes at 50° C., 30 minutes at 75° C., 30 minutes at 100° C., 30 minutes at 120° C. and 30 minutes at 140° C. At the end of the cure cycle, the samples were allowed to cool to room temperature before being removed from the molds. Tensile tests were conducted using an Instron 1120 tensile tester with a strain rate of 20 mm/minute. The results of the tensile tests are shown in Table 6.

TABLE 6

| Anion | Ultimate Tensile Strength, MPa | Elongation, % | Energy, N-m | Modulus, MPa |
|---|---|---|---|---|
| Tensile Test Results | | | | |
| $(CF_3SO_2)_2N^-$ | 0.45 | 488 | 0.038 | 0.12 |
| $SbF_6^-$ (Comparative) | 21.7 | 156 | 2.8 | 353 |
| $(CF_3SO_2)_2CH^-$ (Comparative) | 24.9 | 193 | 3.22 | 240 |
| $C(SO_2cF_3)_3^-$ | 24.5 | 183 | 3.38 | 377 |
| TFPB (Comparative) | 26.6 | 191 | 3.5 | 403 |
| $CF_3SO_3^-$ (Comparative) | 24.9 | 225 | 3.91 | 304 |

The polymer prepared using the methide anion has intermediate physical properties, as measured by the energy at break, of the polymers prepared using the anions listed in the table.

EXAMPLE 13

DSC tests comparing the curing activity of $Cp_2Fe^+$ salts of various anions.

These test were designed to compare the activity of $Cp_2Fe^+$ salts of various anions as thermal catalysts for the thermal curing of epoxy/polyol compositions. Because of the molecular weight differences of the various anions, the weights of the catalysts were adjusted so that $2.34\times10^{-5}$ moles of catalyst were present in each test sample. A stock solution was prepared from 40 g of EPON 828 and 3.8 g of 1,4-butanediol. A DSC test solution was prepared by mixing the appropriate amount of the catalyst with about 0.05 g gamma-butyrolactone then adding 2.0 g of the stock solution. A DSC test sample was about 10 mg sample size in a sealed pan run from room temperature to 300° C. at 10° C./minute. The results of these tests are presented in Table 7.

TABLE 7

| Anion | Exotherm Energy, J/g | Peak Maximum, °C. | Onset Temperature, °C. |
|---|---|---|---|
| DSC Results | | | |
| $HC(SO_2CF_3)_2^-$ (Comparative) | 318 | 139 | 80 |
| TFPB (Comparative) | 349 | 115 | 70 |
| $C(SO_2CF_3)_3^-$ | 354 | 110 | 65 |
| $SbF_6^-$ (Comparative) | 411 | 109 | 75 |
| $N(SO_2CF_3)_2^-$ | 431 | 226 | 70 |
| $CF_3SO_3^-$ (Comparative) | 436 | 189 | 60 |

When the results for the DSC tests are combined with those of the tensile tests, one can see that the methide anion offered the best combination of cure temperature, cure energy and physical properties of the cured composition.

EXAMPLE 14

Cure times

This example illustrates the relative cure times obtained from epoxy compositions and cationic catalysts comprising various anions. The procedure used for the tests was as follows: In an aluminum pan was placed 0.01 g catalyst and 0.04 g gamma-butyrolactone to dissolve the catalyst completely. Next, 2.0 g ERL-4221 (supra) was added and the components were thoroughly mixed. The pan was placed on a hot plate at 80° C. and the contents were stirred. The time at which the sample became essentially insoluble (no longer flowed) was recorded. The results of these tests are shown in Table 8. Note: Examples designated with a "C", such as 14C1 are comparative examples.

TABLE 8

| Examples | Catalyst | Time | Time | Time | Average |
|---|---|---|---|---|---|
| Cure Times, in seconds, of ERL-4221 at 80°C. | | | | | |
| 14A | $Cp_2FeN(CF_3SO_2)_2$ | 85 | 80 | 80 | 82 |
| 14B | $Cp_2FeC(SO_2CF_3)_3$ | 42 | 38 | 36 | 39 |
| 14C1 | $Cp_2FeSbF_6$ | 40 | 35 | 38 | 38 |
| 14C2 | $Cp_2Fe(CF_3SO_2)_2CH$ | 120 | 100 | 90 | 103 |
| 14C3 | $Cp_2FeTFPB$ | 35 | 30 | 38 | 34 |
| 14C4 | $Cp_2FeCF_3SO_3$ | >600 | >600 | >600 | >600 |

TABLE 8-continued

Cure Times, in seconds, of ERL-4221 at 80°C.

| Examples | Catalyst | Time | Time | Time | Average |
|---|---|---|---|---|---|
| 14C5 | LiC(SO$_2$CF$_3$)$_3$ | >600 | >600 | >600 | >600 |

The results demonstrate that (1) salts of the organometallic cationic complexes were much more active as curing agents than the corresponding simple metal salts, (2) cure times of the perfluoroalkylsulfonyl imide and methide complexes were comparable to the fastest anions known in the art and 3) cure times of the imide and methide complexes were much faster than the fluorinated sulfonic acid derivative (Example 14C4).

EXAMPLE 15

Solubility

This example illustrates the enhanced solubility properties of (p-CH$_3$C$_6$H$_4$)$_2$I$^+$ $^-$C(SO$_2$CF$_3$)$_3$ in an organic solvent of low polarity compared to two commonly-used salts: (p-CH$_3$C$_6$H$_4$)$_2$I$^+$ $^-$O$_3$SCF$_3$ and (p-CH$_3$C$_6$H$_4$)$_2$I$^+$PF$_6$$^-$. Anhydrous diethyl ether (Aldrich) was chosen as a test solvent since its polarity is similar to monomers, such as epoxy monomers, commonly employed in cationic addition polymerization. Solubilities were measured by taking known weights of each of the bis(tolyl)iodonium salts and diluting the samples portionwise with diethyl ether, with thorough mixing between portions, until all of the solid dissolved. Solubilities are expressed as a percent by weight of the iodonium salt dissolved in diethyl ether solution at room temperature and are summarized in Table 9.

TABLE 9

| Initiator Salt | Solubility (Wt % in Diethyl ether) |
|---|---|
| (p-CH$_3$C$_6$H$_4$)$_2$I$^+$ $^-$C(SO$_2$CF$_3$)$_3$ | >71% |
| (p-CH$_3$C$_6$H$_4$)$_2$I$^+$ $^-$O$_3$SCF$_3$ (Comparative) | <<0.20% |
| (p-CH$_3$C$_6$H$_4$)$_2$I$^+$PF$_6$$^-$ (Comparative) | <<0.14% |

Significantly, the (p-CH$_3$C$_6$H$_4$)$_2$I$^+$ $^-$O$_3$SCF$_3$ and (p-CH$_3$C$_6$H$_4$)$_2$I$^+$PF$_6$$^-$ showed no evidence of dissolution even at the relatively low concentrations listed; therefore these values represent upper limits to the actual solubilities. The (p-CH$_3$C$_6$H$_4$)$_2$I$^+$ $^-$C(SO$_2$CF$_3$)$_3$ salt, on the other hand, dissolved completely after addition of the first portion of ether solvent and is therefore actually more soluble than the tabulated value. Thus, the methide salt was at least a factor of 1000 more soluble in ether than either the triflate or the hexafluorophosphate salt.

EXAMPLE 16

Comparing the physical properties of compositions cured using (mesitylene)$_2$ Fe$^{2+}$ salts with various counterions. Note: Examples designated with a "C", such as 16C6 are comparative examples.

The stock solution of resin used in these examples was prepared by combining 1,6-hexanediol (42.8 g) and 1,4-cyclohexanedimethanol (42.8 g) with EPON 828 (614 g) to give an epoxy/alcohol ratio of 1/0.4. The mixture was stirred well at 80° C., then cooled to room temperature before use.

Under low room light, the formulations used in Comparative Example 16C6 and Example 16 were prepared by dissolving the catalyst, (mesitylene)$_2$Fe(SbF$_6$)$_2$ (0.20 g) for Comparative Example 16C$_6$ and (mesitylene)$_2$Fe(C(SO$_2$CF$_3$)$_3$)$_2$ (0.20 g) for Example 16, into propylene carbonate (0.31 g). The stock solution (20.1 g) was added, mixed thoroughly, and allowed to stand at room temperature for 30 min to eliminate air bubbles.

The tensile test samples were cured by heating from room temperature to 40° C. over 23 min, then holding at 140° C. for 5 hours. The tensile tests were conducted using an Instron 1120 tensile tester with a strain rate of 5 mm/min. The results of the tensile tests are shown in Table 10, and show that samples cured using (mesitylene)$_2$Fe(C(SO$_2$CF$_3$)$_3$)$_2$ have improved toughness as measured by the energy at break.

TABLE 10

| | Tensile Tests | | | |
|---|---|---|---|---|
| Examples | Tensile Strength, MPa | Elongation at Break, % | Energy, N-m | Modulus, MPa |
| 16C6 | 43.7 | 7.1 | 0.22 | 844 |
| 16 | 49.6 | 8.5 | 0.29 | 768 |

EXAMPLE 17

Comparing the physical properties of compositions cured using mesitylene)$_2$Fe$^{2+}$ salts with various counterions. Note: Examples designated with a "C", such as 17C$_7$ are comparative examples.

The stock solution of resin used in these examples was prepared by combining polyethylene glycol 200 (50 g) with EPON 828 (150 g). The mixture was stirred well at 80° C., then cooled to room temperature before use.

Under low room light, the formulations used in Comparative Example 17C7 and Example 17 were prepared by dissolving the catalyst, (mesitylene)$_2$Fe(SbF$_6$)$_2$ (0.15 g) for Comparative Example 17C7 and (mesitylene)$_2$Fe(C(SO$_2$CF$_3$)$_3$)$_2$ (0.15 g) for Example 17, into 3-methylsulfolane (0.31 g). The stock solution (30 g) was added, mixed thoroughly, and allowed to stand at room temperature for 30 rain to eliminate air bubbles.

The tensile test samples were cured by heating from room temperature to 140° C. over 23 min, then holding at 140° C. for two hours. The tensile tests were conducted using an Instron 1120 tensile tester with a strain rate of 5 mm/min. The results of the tensile tests are shown in Table 11, and show that the samples cured using (mesitylene)$_2$Fe(C(SO$_2$CF$_3$)$_3$)$_2$ have improved toughness as measured by the energy at break.

TABLE 11

| | Tensile Tests | | | |
|---|---|---|---|---|
| Examples | Tensile Strength, MPa | Elongation at Break, % | Energy, N-m | Modulus, MPa |
| 17C7 | 13.9 | 167.2 | 1.94 | 121 |
| 17 | 14.3 | 180.1 | 2.23 | 205.5 |

EXAMPLE 18

Synthesis of Lithium Methide, $Li^+{}^-C(SO_2CF_3)_3$

A rigorously-dried glass reaction kettle equipped with a dry ice condenser, thermocouple temperature probe, mechanical stirrer, temperature-controlled water bath, nitrogen inlet and a dip tube was charged with 173 mL 3M $CH_3MgCl$ in THF (Aldrich) and cooled to 0° C. in an ice water bath. Tributylamine-washed, HF-free, anhydrous $CF_3SO_2F$ of 94% purity (which can be prepared by electrochemical fluorination methods as described in U.S. Pat. No. 2,519,983 and in *Chemistry of Organic Fluorine Compounds*, Milos Hudlicky, ed., 2nd ed., Prentice Hall (New York) 1992, p. 73–76) was slowly metered into the rapidly stirred solution at a rate of ca. 0.2 g/min through the dip tube. The reaction temperature rose to ca. 17° C. during the initial stages. After approximately 75% of the $CF_3SO_2F$ was added and the reaction exotherm had diminished, the ice water bath was heated to 30° C. $CF_3SO_2F$ addition was continued at ca. 0.2 g/min until the full 69.03 g was added, then the reaction mixture was stirred and heated in a 30° C. water bath for an additional 1.5 hours then allowed to stir overnight at 23° C. The reaction mixture was transferred to a 1 liter flask, using two 100 mL rinses of fresh THF, after which the THF solvent and excess $CF_3SO_2F$ was evaporated at 70° C. under 20 mm vacuum. The remaining solid residue was combined with 200 mL of 5 M sulfuric acid and mixed well. The acid mixture was cooled in an ice water bath to below room temperature, then extracted with two 175 mL portions of i-propyl ether. The ether extracts were combined and evaporated at 40° C. and 20 mm vacuum to obtain the crude $(CF_3SO_2)_3CH$ as a light brown oil. The oil was combined with 350 mL of water and distilled through a short Vigreux column until 100 mL of distillate was collected to remove residual ether. The ether-free, aqueous solution was extracted with two 150 mL portions of $CH_2Cl_2$ and the resulting colorless aqueous phase was treated with 81 mL of a 25 weight percent aqueous solution of tetramethylammonium hydroxide (Aldrich Chemical Co.) to quantitatively precipitate the $(CH_3)_4N^+{}^-C(SO_2CF_3)_3$ salt. The crystalline white precipitate was filtered by suction through a glass frit, washed with 3×70 mL portions of deionized water, then partially dried by suction. The isolated solid was transferred to a flask equipped with a short Vigreux column, mechanical stirrer and a distillation head where it was completely dissolved in a minimum volume of boiling methanol. Once dissolved, an equal volume of water was added in portions with stirring, causing partial recrystallization. Recrystallization was then completed by azeotropic distillation of methanol with stirring while periodically adding water to compensate for volume loss. The resulting slurry was cooled to ca. 0° C. for two hours and filtered by suction, washed with water, dried partially by suction, then recrystallized a second time from methanol/water according to the above procedure. After drying in vacuo, 41.6 g $(CH_3)_4N^+{}^-C(SO_2CF_3)_3$ (66% based upon $CH_3MgCl$) was obtained.

The highly purified tetramethylammonium salt was combined with 200 mL of 5.0M aqueous sulfuric acid in a separatory funnel and extracted with three 125 mL portions of methyl t-butyl ether. The combined ether fractions were treated with 38 g of $Li_2CO_3$ in portions with stirring at room temperature causing evolution of $CO_2$. After stirring overnight the mixture was filtered by suction through a glass frit and the filtrate evaporated on a rotary evaporator to give a nonvolatile oil. Toluene was added and the solvent evaporated again under vacuum at approximately 70° C. to remove residual ether. This was repeated two more times until the nonvolatile residue solidified to a fine white powder. The solid product was dried in vacuo at 120° C. and $10^{-3}$ mm for ca. 24 hours giving 33.4 g of anhydrous product (93% yield based upon $(CH_3)_4N^+{}^-C(SO_2CF_3)_3$. $^1H$ and 19F NMR spectroscopy indicated that the product was 97.5% pure $Li^+{}^-C(SO_2CF_3)_3$.

EXAMPLE 19

Preparation of bis-perfluoro(dimethlaminoethyl)sulfonimide $HN(SO_2C_2F_4N(CF_3)_2)_2$ Bis-(dimethylaminoethyl)sulfonyl fluoride, $(CH_3)_2NC_2H_4SO_2F$, is prepared according to techniques described in U.S. Pat. No. 3,476,753, incorporated herein by reference. This hydrocarbon sulfonyl fluoride is perfluorinated by electrochemical fluorination methods as described in U.S. Pat. No. 2,519,983 and in *Chemistry of Organic Fluorine Compounds*, Milos Hudlicky, ed., 2nd ed., Prentice Hall (New York) 1992, p. 73–76, and is purified by standard means. Treatment of the perfluorosulfonyl fluoride with excess ammonia in tetrahydrofuran according to standard methods gives the corresponding sulfonamide, $(CF_3)_2NC_2F_4SO_2N_2$.

A 500 mL Fisher-Porter pressure bottle equipped with a magnetic stir bar and pressure head was charged with 30 g $(CF_3)_2NC_2F_4SO_2NH_2$ (Example 21), 27.4 g triethlamine and 31.8 g $(CF_3)_2NC_2F_4SO_2F$ (prepared according to techniques described in U.S. Pat. No. 3,476,753). The flask was sealed and heated to 100° C for 37 hours with stirring. After cooling, the volatile components of the reaction mixture were evaporated under reduced pressure. The residue was dissolved in 300 mL methylene chloride and washed with 3×300 mL water, then dried over $MgSO_4$, filtered, and the solvent removed under reduced pressure. The residue was distilled from excess polyphosphoric acid over a pressure and temperature range starting from 105° C. and 3 torr and ending at 97° C. and 0.2 torr to yield 40.13 g of a pale yellow-orange liquid that solidified on standing, and corresponded to the formula $HN(SO_2C_2F_4N(CF_3)_2)_2$. This sulfonimide is useful in the preparation of imide salts of the invention.

EXAMPLE 20

Adhesive Corrosiveness Test

A test apparatus was constructed as follows: A 3.2 cm×1.0 cm glass slide coated with 30 ohms/square of indium tin oxide (ITO) (commercially available from Orient Glass, Inc., Somerset, N.J. as Part No. P110C-H-PL) was patterned via standard photoetch methods such that a 0.05 mm (2 mil)×3.2 cm stripe was formed approximately on the center of the long axis of the glass slide connecting two pads of ITO of approximately 1 cm×0.2–0.4 cm on each end of the glass slide, providing two large electrical contact areas at each end of the narrow stripe. The final configuration resembled a glass slide with an elongated dumbbell of ITO patterned on it, the center bar of which was the elongated stripe.

Two adhesive stock solutions were prepared, as 50% solids, of a mixture of 35 parts of EPON™ 828 (epoxy resin, Shell Chemicals), 25 parts EPON 1079 (epoxy resin, Shell Chemicals), and 40 parts PKHJ™ (phenoxy resin, Phenoxy Associates, Rock Hill, S.C.) in a 1:1 mixture of methyl ethyl ketone and tetrahydrofuran. Curable resin solutions were prepared as follows;

| Adhesive A | Adhesive B (Comparative) |
|---|---|
| 10 g stock solution | 10 g stock solution |
| 0.031 g Mes$_2$Fe$^{2+}$ (⁻C(SO$_2$CF$_3$)$_3$)$_2$ | 0.030 g Mes$_2$Fe$^{2+}$(⁻SbF$_6$)$_2$ (Comparative) |
| 0.030 g di-t-amyl oxalate | 0.030 g di-t-amyl oxalate |

Two samples of Adhesive A (A$_1$ and A2) and three samples of Adhesive B (B$_1$, B$_2$ and B$_3$) were coated onto silicone-treated poly(ethyleneterephthalate) (PET) film and air dried to give adhesive films of approximately 30 μm thickness.

Five glass slides, patterned with ITO as described above, were cleaned with methyl alcohol and blown free of dust. Each of the adhesive samples was then laminated to the ITO-patterned side of a glass slide such that only the elongated 0.05 mm strip was covered with adhesive, leaving the end pads of ITO uncovered. Lamination was accomplished by heating the glass slide with the adhesive attached to it on a hot plate at 140° C. for approximately 5 seconds, cooling the slide briefly to allow removal of the PET liner, then reheating the adhesive-coated slide for an additional 5 minutes to complete curing of the adhesive. All samples cured to a hard, clear state.

Electrical resistance across the thin ITO strip was measured prior to the final cure, immediately thereafter, and at specified intervals (days) of storage at 85° C and 85% relative humidity, using a Fluke multimeter Model 77 Series II (J. Fluke Manuf. Co., Everett, Wash.). Results are presented in Table 12.

TABLE 12

| | Corrosion Tests | | | | |
|---|---|---|---|---|---|
| | Mes$_2$Fe$^+$ (⁻C(SO$_2$CF$_3$)$_3$)$_2$ catalyst (resitance, kΩ) | | Mes$_2$Fe$^+$ (SbF$_6$)$_2$ catalyst (resitance, kΩ) (Comparative) | | |
| Days | A$_1$ | A$_2$ | B$_1$ | B$_2$ | B$_3$ |
| Pre-Cure | 10.26 | 9.65 | 9.78 | 10.22 | 10.03 |
| 0 | 10.19 | 9.63 | 9.77 | 10.18 | 10.02 |
| 1 | 10.15 | 9.59 | 9.76 | 10.43 | 10.04 |
| 4 | 10.21 | 9.63 | 9.84 | 10.63 | 10.09 |
| 12 | 10.23 | 9.65 | 9.89 | 10.95 | 10.14 |
| 25 | 10.24 | 9.60 | 9.91 | 11.08 | 10.19 |
| 51 | 10.26 | 9.68 | 9.91 | 11.14 | 10.56 |
| change, kΩ | 0.07 | 0.05 | 0.13 | 0.96 | 0.54 |

Samples prepared with the art-known SbF$_6$-anion catalyst clearly showed a significantly greater increase in resistance over the test period as compared to samples prepared using the "methide"-anion catalyst of the invention. The increase in resistance (i.e., decreased conductivity) is attributed to increased corrosion of the ITO conductive strip by the SbF$_6$-containing catalyst, which is known to be a source of free fluoride (F⁻) ions in cured compositions.

What is claimed:

1. An energy activatable salt wherein the energy activatable salt has (1) a cation comprising at least one of (a) an organometallic cation, wherein the organometallic cation comprises (i) substituted or unsubstituted aromatic compounds based on arene or cyclopentadienyl ligands and, (ii) a transition metal atom, (b) an I-, P-, C- and S-centered organic onium cation, or (c) a mixture thereof, and (2) a sufficient number of an anion to neutralize the charge of the cation, wherein the anion comprises a tris-(highly fluorinated alkylsulfonyl)methide, tris-(fluorinated arylsulfonyl)methide, bis-(highly fluorinated alkylsulfonyl)imide, bis-(fluorinated arylsulfonyl)imide, mixed aryl- and alkylsulfonyl imides and methides and any combinations thereof and with the proviso that the salt is not a diazonium salt, an ammonium salt, or a simple metal salt.

2. The compound according to claim 1 wherein the salt is a photosensitive salt.

3. A photosensitive compound according to claim 2 in an organic solution wherein the photosensitive compound is spectrally sensitized by a cationic dye having an anion selected from the group consisting of (a) a highly fluorinated alkylsulfonyl methide, (b) a fluorinated arylsulfonyl methide, (c) a highly fluorinated alkyl sulfonyl imide or (d) a fluorinated arylsulfonyl imide, (e) mixed aryl- and alkylsulfonyl imides and methides and (f) any combinations thereof.

4. The compound according to claim 1 wherein the salt is a thermally sensitive salt.

5. The compound according to claim 1 wherein the salt comprises a anion having one of a formula:

or

wherein each R$_f$ is independently selected from the group consisting of highly fluorinated or perfluorinated alkyl or fluorinated aryl radicals and may be cyclic, when a combination of any two R$_f$ groups are linked to form a bridge, further, the R$_f$ alkyl chains contain from 1–20 carbon atoms and may be straight, branched, or cyclic, such that divalent oxygen, trivalent nitrogen or hexavalent sulfur may interrupt the skeletal chain, further when R$_f$ contains a cyclic structure, such structure has 5 or 6 ring members, optionally, 1 or 2 of which are heteroatoms.

6. The compound according to claim 5 wherein the salt comprises at least one of (C$_2$F$_5$SO$_2$)$_2$N⁻, (C$_4$F$_9$SO$_2$)$_2$N⁻, (C$_8$F$_{17}$SO$_2$)$_3$C⁻, (CF$_3$SO$_2$)$_3$C⁻, (CF$_3$SO$_2$)$_2$N⁻, (C$_4$F$_9$SO$_2$)$_3$C⁻, (CF$_3$SO$_2$)$_2$(C$_4$F$_9$SO$_2$)C⁻, (CF$_3$SO$_2$)(C$_4$F$_9$SO$_2$)N⁻, [(CF$_3$)$_2$NC$_2$F$_4$SO$_2$]$_2$N⁻, (CF$_3$)$_2$NC$_2$F$_4$SO$_2$C⁻(SO$_2$CF$_3$)$_2$, (3,5-bis(CF$_3$)C$_6$H$_3$)SO$_2$N⁻SO$_2$CF$_3$,

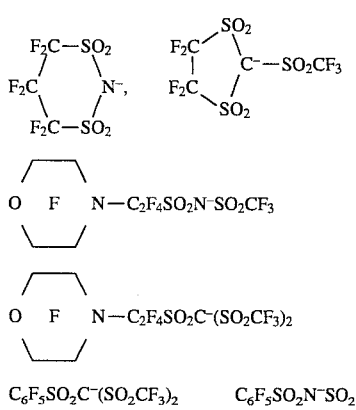

7. The compound according to claim 1 wherein the cation is organic onium cations, including aliphatic or aromatic Group IVA-VIIA (CAS version) centered onium salts, wherein aryl is an unsubstituted or substituted aromatic moiety having up to four independently selected substituents and the substituents on the aryl ring have less than 30 carbon atoms and up to 10 heteroatoms selected from N,S, non-peroxidic O, P, As, Si, Sn, B, Ge, Te, or Se.

8. The compound according to claim 7 wherein the cation includes aliphatic or aromatic I-, S-, P- or C-centered onium salts.

9. The compound according to claim 7 wherein the anion is at least one of $(CF_3SO_2)_2N^-$, $(CF_3SO_2)_3C^-$, and $(C_4F_9SO_2)_3C^-$ anions and the cation is at least one of diphenyliodonium, ditolyliodonium, didodecylphenyliodonium, (4-octyloxyphenyl)phenyliodonium, and bis(methoxyphenyl)iodonium.

10. The compound according to claim 7 wherein the anion is at least one of $(CF_3SO_2)_2N^-$, $(CF_3SO_2)_3C^-$, and $(C_4F_9SO_2)_3C^-$ anions and the cation is a least one of triphenylsulfonium, diphenyl-4-thiophenoxyphenylsulfonium, and 1,4-phenylene-bis(diphenylsufonium).

11. The compound according to claim 1 wherein the cation is an organometallic complex cation essentially free of metal hydride or metal alkyl functionality and has the formula:

$$[(L^1)(L^2)M]^{+q}$$

wherein

M is a metal selected from the group consisting of Cr, Mo, W, Mn, Re, Fe, Ru, Os, Co, Rh, Ir, Pd, Pt and Ni, $L^1$ is 1 or 2 cyclic, polyunsaturated ligands that can be the same or different ligand selected from the group consisting of substituted and unsubstituted cyclopentadienyl, cyclohexadienyl, and cycloheptatrienyl, cycloheptatriene, cyclooctatetraene, heterocyclic compounds and aromatic compounds selected from substituted or unsubstituted arene compounds and compounds having 2 to 4 fused rings, and units of polymers each capable of contributing 3 to 8 electrons to the valence shell of M;

$L^2$ is none, or 1 to 3 nonanionic ligands contributing an even number of electrons that can be the same or different ligand selected from the group of carbon monoxide, ketones, olefins, ethers, nitrosonium, phosphines, phosphites, and related derivatives of arsenic and antimony, organonitriles, amines, alkynes, isonitriles, dinitrogen, with the proviso that the total electronic charge contributed to M results in a net residual positive charge of q to the complex; and q is an integer having a value of 1 or 2, the residual charge of the complex cation.

12. The compound according to claim 11 wherein the cation is an organometallic cation wherein M is a metal selected from the group consisting of Cr, Mo, W, Mn, Fe, Ru, Co, Pd and Ni.

13. The compound according to claim 11 wherein the anion is at least one of $(CF_3SO_2)_2N^-$, $(CF_3SO_2)_3C^-$, and $(C_4F_9SO_2)_3C^-$ anions and the cation is at least one of bis($\eta^5$-cyclopentadienyl)iron(1+), bis($\eta^5$-methylcyclopentadienyl)iron (1+), ($\eta^5$-cyclopentadienyl)($\eta^5$-methylcyclopentadienyl)iron(1+), and bis($\eta^5$-trimethylsilylcyclopentadienyl)iron(1+).

14. The compound according to claim 11 wherein the anion is at least one of $(CF_3SO_2)_2N^-$, $(CF_3SO_2)_3C^-$, and $(C_4F_9 SO_2)_3C^-$ anions and the cation is at least one of bis($\eta^6$-xylenes)iron(2+), bis($\eta^6$-mesitylene)iron(2+), bis($\eta^6$-durene) iron(2+), bis($\eta^6$-pentamethylbenzene)iron(2+), and bis($\eta^6$-dodecylbenzene)iron (2+).

15. The compound according to claim 11 wherein the anion is at least one of $(CF_3SO_2)_2N^-$, $(CF_3SO_2)_3C^-$, and $(C_4F_9SO_2)_3C^-$ anions and the cation is at least one of ($\eta^5$-cyclopentadienyl)($\eta^6$-xylenes)iron(1+), ($\eta^5$-cyclopentadienyl)($\eta^6$-toluene)iron(1+), ($\eta^5$-cyclopentadienyl)($\eta^6$-mesitylene)iron( 1+), ($\eta^5$-cyclopentadienyl)($\eta^6$-pyrene)iron(1+), ($\eta^5$-cyclopentadienyl)($\eta^6$-naphthalene)iron(1+), and ($\eta^5$-cyclopentadienyl)($\eta^6$-dodecylphenyl)iron(1+).

16. The compound according to claim 1 further comprising a photosensitizer or a photoaccelerator.

17. An photosensitive compound in an organic solvent, wherein the photosensitive compound is the energy activatable salt according to claim 1.

18. The photosensitive compound in an organic solvent according to claim 17 wherein the photosensitive compound comprises a photocatalyst or photoinitiator for polymerization of a polymerizable compound, which polymerizable compound is also present in the organic solvent and the energy activable salt further includes diazonium salts of the (a) a highly fluorinated alkylsulfonyl methide, (b) a fluorinated arylsulfonyl methide, (c) a highly fluorinated alkyl sulfonyl imide or (d) a fluorinated arylsulfonyl imide anion, (e) mixed aryl- and alkylsulfonyl imides and methides and (f) any combinations thereof.

19. An energy activable compound in an organic solvent, wherein the energy activable compound is the energy activable salt according to claim 1.

20. A curable composition comprising the energy-activatable salt according to claim 1 and one or more monomers, the cure of which can be initiated or catalyzed by species released upon energy activation of the energy activable salt, wherein the energy activable salt further includes diazonium salts of the (a) a highly fluorinated alkylsulfonyl methide, (b) a fluorinated arylsulfonyl methide, (c) a highly fluorinated alkyl sulfonyl imide or (d) a fluorinated arylsulfonyl imide anion, (e) mixed aryl- and alkylsulfonyl imides and methides and (f) any combinations thereof.

21. The curable composition according to claim 20 wherein the monomer(s) are polymerizable by (1) cationic addition or (2) acid-catalyzed step-growth polymerization.

22. The curable composition according to claim 20 wherein the monomer is selected from the group consisting of ethylenically-unsaturated free-radically polymerizable monomers.

23. The curable composition according to claim 20 wherein the monomer is selected from the group consisting of epoxides and vinyl ether monomers.

24. The curable composition according to claim 20 further comprising conductive particles and optionally a thermoplastic resin and the monomer is an epoxy resin.

25. A conductive adhesive, wherein the conductive adhesive is prepared by energy activated curing of the curable composition according to claim 24.

26. The curable composition according to claim 24 wherein the monomer is an electronic grade epoxy resin.

27. A non-corrosive adhesive or coating, wherein the non-corrosive adhesive or coating is prepared by energy activated curing of the curable composition according to claim 20.

* * * * *